United States Patent
Ando et al.

(10) Patent No.: US 11,183,632 B2
(45) Date of Patent: Nov. 23, 2021

(54) SELF-ALIGNED EDGE PASSIVATION FOR ROBUST RESISTIVE RANDOM ACCESS MEMORY CONNECTION

(71) Applicant: International Business Machines Corporation, Armonk, NY (US)

(72) Inventors: Takashi Ando, Eastchester, NY (US); Ruilong Xie, Niskayuna, NY (US); Pouya Hashemi, Purchase, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 16/720,091

(22) Filed: Dec. 19, 2019

(65) Prior Publication Data

US 2021/0193920 A1    Jun. 24, 2021

(51) Int. Cl.
*H01L 45/00*      (2006.01)
*H01L 27/24*      (2006.01)

(52) U.S. Cl.
CPC ...... *H01L 45/1253* (2013.01); *H01L 27/2463* (2013.01); *H01L 45/08* (2013.01); *H01L 45/1233* (2013.01); *H01L 45/146* (2013.01); *H01L 45/1608* (2013.01)

(58) Field of Classification Search
CPC .................. H01L 45/1233; H01L 27/2463
See application file for complete search history.

(56) References Cited

U.S. PATENT DOCUMENTS

| 8,198,620 | B2 | 6/2012 | Chen et al. |
| 8,759,186 | B2 | 6/2014 | Yeh et al. |
| 9,136,472 | B2 | 9/2015 | Wells |
| 9,431,603 | B1 | 8/2016 | Hsieh |

(Continued)

FOREIGN PATENT DOCUMENTS

| WO | 2018004697 A1 | 1/2018 |
| WO | 2018009154 A1 | 1/2018 |
| WO | 2019068094 A1 | 4/2019 |

OTHER PUBLICATIONS

International Search Report for International Application No. PCT/IB2020/061895, International Filing Date Dec. 14, 2020, dated Mar. 23, 2021, 10 pages.

(Continued)

*Primary Examiner* — Mark V Prenty
(74) *Attorney, Agent, or Firm* — L. Jeffrey Kelly

(57) ABSTRACT

A resistive random access memory (RRAM) structure includes top and bottom electrodes electrically coupled with first and second metal connection lines, respectively, the first and second metal connection lines providing electrical connection to the RRAM structure. A layer of resistive switching material is disposed between the top and bottom electrodes of the RRAM structure. The resistive switching material exhibits a measurable change in resistance under influence of at least an electric field and/or heat. Dielectric spacers are formed on sidewalls of at least the bottom electrode of the RRAM structure. The RRAM structure further includes a passivation layer formed on an upper surface of the dielectric spacers and covering at least a (Continued)

portion of sidewalls of the top electrode. The passivation layer is self-aligned with the first metal connection line.

12 Claims, 21 Drawing Sheets

(56) References Cited

U.S. PATENT DOCUMENTS

| | | | |
|---|---|---|---|
| 9,711,714 | B2 | 7/2017 | Nagashima |
| 10,818,544 | B2 * | 10/2020 | Lin .................. H01L 43/12 |
| 2013/0217199 | A1 | 8/2013 | Huang et al. |
| 2016/0020390 | A1 | 1/2016 | Chang |

OTHER PUBLICATIONS

Olin-Ammentorp et al., "Resistive Transition Metal Oxide Memory", Senior Design Projects, Microelectronic Engineering, 1-4, 2015.
Application No. IB2020/061895, Filed on Dec. 14, 2020, entitled: "Self-Aligned Edge Passivation for Robust Resistive Random Access Memory Connection", P201902137PCT01, 40 pages.
Waser, "Redox-based Tera-bit memories", EMRL, Electronic Materials Research Laboratory, Accessed on Apr. 21, 2021, 12 pages.
Wong et al., "Metal-Oxide RRAM", ©2012 IEEE, vol. 100, No. 6, Jun. 2012, pp. 1951-1970.

\* cited by examiner

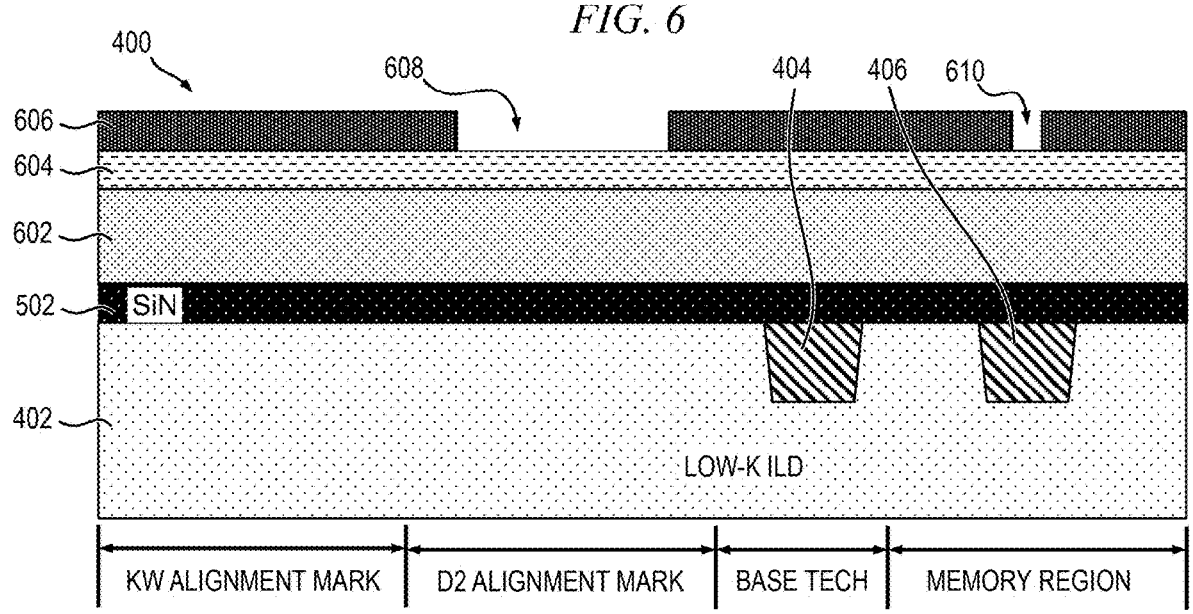
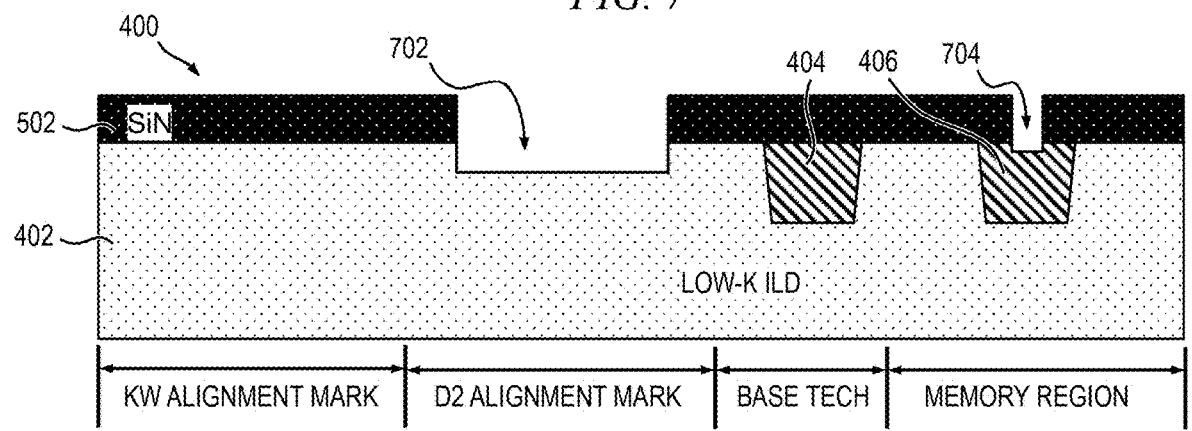

SELF-ALIGNED EDGE PASSIVATION FOR ROBUST RESISTIVE RANDOM ACCESS MEMORY CONNECTION

BACKGROUND

The present invention relates generally to the electrical, electronic and computer arts, and, more particularly, to resistive random access memory.

Resistive random access memory (RRAM or ReRAM) is considered a promising technology for more scalable, high-density and high-performance non-volatile storage solutions. RRAM is particularly favorable for use as electronic synapse devices or memristers for neuromorphic computing. Neuromorphic engineering draws inspiration from multiple technological fields, including, for example, biology, physics, mathematics, computer science and electronic engineering, to construct artificial neural systems whose physical architecture and design principles are based on biological nervous systems. In neuromorphic computing applications, a resistive memory device can be used as a connection (i.e., synapse) between a pre-neuron and a post-neuron, representing a connection weight in the form of device resistance.

In an artificial neural system application, multiple pre-neurons and post-neurons can be connected through a crossbar array of RRAMs, which naturally expresses a fully connected neural network. In order to make a large-scale crossbar array, it is desirable to make line resistance as low as possible in order to minimize the voltage drop across the line. For this reason, a copper line is preferred. However, the integration of copper lines with RRAM pillars has posed significant design and reliability challenges.

An RRAM pillar/stack typically includes titanium nitride (TiN) electrodes for compatibility with complementary metal-oxide semiconductor (CMOS) process flow. The incorporation of RRAM devices in a copper damascene process requires an additional metal mask layer (e.g., tantalum nitride (TaN)) on top of the RRAM stack for protection of the stack during TiN hardmask removal. Additionally, sidewall protection is generally required since the dimensions of copper vias in the crossbar array are typically larger than those of RRAM stack pillars. A conventional spacer is often damaged during the formation of a via opening, thereby undesirably creating a weak spot for subsequent TiN wet etching.

SUMMARY

The present invention, as manifested in one or more embodiments, beneficially provides a resistive random-access memory (RRAM) structure, and methods for fabricating an RRAM structure, which provides reduced connection resistance, particularly advantageous for use in a crossbar array. In one or more embodiments, the RRAM structure incorporates a self-aligned passivation feature surrounding at least a bottom electrode of the RRAM structure. The passivation feature beneficially prevents an upper metal line from shorting to the bottom electrode, despite erosion of RRAM sidewall spacers which may occur during deep etching used to form vias for connecting upper and lower metal lines in the crossbar array.

In accordance with an embodiment of the invention, an RRAM structure includes top and bottom electrodes electrically coupled with first and second metal connection lines, respectively, the first and second metal connection lines providing electrical connection to the RRAM structure. A layer of resistive switching material is disposed between the top and bottom electrodes of the RRAM structure. The resistive switching material exhibits a measurable change in resistance under influence of at least an electric field and/or heat. Dielectric spacers are formed on sidewalls of at least the bottom electrode of the RRAM structure. The RRAM structure further includes a passivation layer formed on an upper surface of the dielectric spacers and covering at least a portion of sidewalls of the top electrode. The passivation layer is self-aligned with the first metal connection line.

In accordance with an embodiment of the invention, a method of forming an RRAM structure includes: forming a bottom electrode on an upper surface of a first metal connection line; forming a layer of resistive switching material on at least a portion of an upper surface of the bottom electrode, the resistive switching material exhibiting a measurable change in resistance under influence of at least one of an electric field and heat; forming a top electrode on an upper surface of the layer of resistive switching material; forming dielectric spacers formed on sidewalls of at least the bottom electrode; and forming a passivation layer on an upper surface of the dielectric spacers and covering at least a portion of sidewalls of the top electrode, the passivation layer being self-aligned with a second metal connection line in electrical connection with the top electrode.

As used herein, "facilitating" an action includes performing the action, making the action easier, helping to carry the action out, or causing the action to be performed. Thus, by way of example only and without limitation, in the context of a semiconductor fabrication methodology, steps performed by one entity might facilitate an action carried out by another entity to cause or aid the desired action(s) to be performed. For the avoidance of doubt, where an actor facilitates an action by other than performing the action, the action is nevertheless performed by some entity or combination of entities.

Techniques of the present invention can provide substantial beneficial technical effects. By way of example only and without limitation, RRAM structures and/or methods of fabricating an RRAM structure according to embodiments of the invention may provide one or more of the following advantages:

- reduced connection resistance between the RRAM structure and corresponding metal connection lines;
- reduced likelihood of electrical shorting between electrodes of the RRAM structure and corresponding metal connection lines;
- facilitates integration of RRAM structures formed using CMOS processing with copper damascene processing used to formed metal connection lines in a crossbar array;
- enables scaling of RRAM pillar size below a size of the corresponding contact.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein:

FIGS. 4 through 26 are cross-sectional views depicting exemplary processing steps/stages in the fabrication of exemplary RRAM structures providing reduced connection resistance, according to embodiments of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments thereof, will be described herein in the context of an illustrative resistive random-access memory (RRAM or ReRAM) structure, and methods for fabricating such structures, having self-aligned edge passivation for reducing connection resistance, particularly when the RRAM structure is utilized, for example, in a crossbar array. It is to be appreciated, however, that the invention is not limited to the specific structures and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

Figure 1:
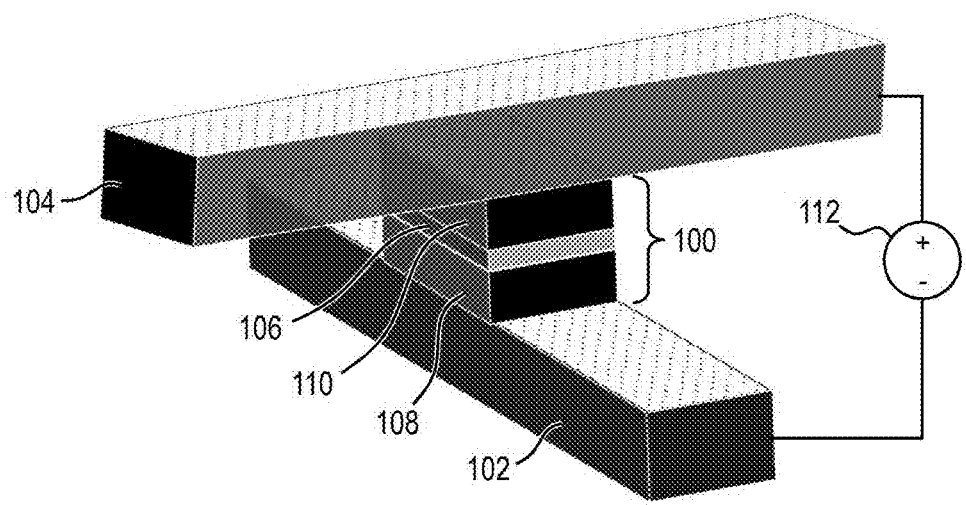
FIG. 1 is a perspective view depicting at least a portion of a standard resistive random access memory (RRAM) cell.

FIG. 1 is a perspective view depicting at least a portion of a basic RRAM cell 100. The RRAM cell 100 is disposed between a bottom conductor 102, which may be a word line, and a top conductor 104, which may be a bit line. The RRAM cell 100 includes a junction with a thin resistive switching material 106 sandwiched between a bottom electrode 108 and a top electrode 110 of the RRAM cell. Titanium nitride (TiN) is often employed for the bottom and top electrodes 108, 110 and a metal oxide (e.g., hafnium oxide (HfO)) is often used as the resistive switching material 106. The switching effect of RRAM involves the creation of defects in the switching material 106, which may be referred to as oxygen vacancies (i.e., oxide bond locations where the oxygen has been removed), that can charge and drift under the influence of an electric field, which may be generated by an applied bias voltage 112, or heat. This applied electric field or heat results in a motion of oxygen ions and vacancies in the switching material 106 in a manner consistent with the motion of electrons and holes in a semiconductor, which in turn causes a measurable change in resistance of the device.

Figure 2:
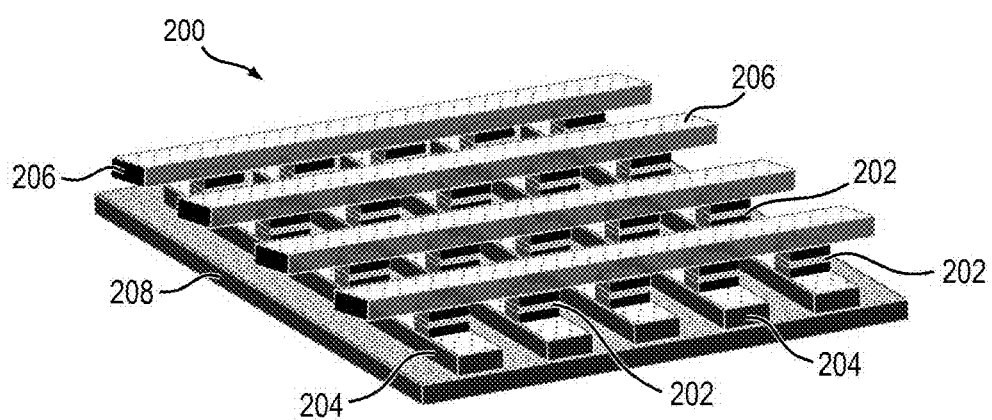
FIG. 2 is a perspective view depicting at least a portion of a crossbar array including a plurality of RRAM cells in which aspects of the present invention may be employed.

FIG. 2 is a perspective view depicting at least a portion of a crossbar array 200 in which aspects of the present invention may be employed. The crossbar array 200 includes a plurality of RRAM cells 202, with each RRAM cell disposed between a unique intersection of a corresponding bottom conductor 204, which may be a word line, and top conductor 206, which may be a bit line. Although not explicitly shown (but implied), a cell selection device (e.g., transistor or diode) is generally connected in series between each RRAM cell 202 and either of the corresponding top or bottom conductors 206, 204 and functions to selectively access the individual cells. The bottom conductors 204 are preferably disposed on a substrate 208, such as, for example, an interlayer dielectric (ILD) layer.

As previously stated, in order to fabricate a large-scale crossbar array, it is desirable to reduce line resistance in the array to minimize the voltage drop across the lines. To achieve this objective, copper is preferably utilized to form the bottom and top conductors in the crossbar array (e.g., 204, 206), for example by using a copper damascene process. However, the integration of RRAM with a copper damascene process presents several challenges that can have a significant impact on RRAM device reliability and cost.

As previously stated, an RRAM pillar typically comprises TiN electrodes for compatibility with CMOS process flow. Copper damascene processing uses TiN as a mask, so when the TiN mask is removed by selective etching during the copper damascene process, the TiN electrode of the RRAM pillar is also etched. Therefore, incorporation of RRAM in copper damascene processing generally requires an additional metal barrier layer formed on top of the RRAM pillar which protects the top electrode of the RRAM pillar from being etched during the copper damascene TiN hardmask removal.

Another challenge in integrating RRAM with copper damascene processing is that since the dimensions of the upper copper lines are typically much larger than those of the RRAM pillar, the upper copper line has a tendency to extend beyond and wrap around the sides of the RRAM pillar, thus increasing the likelihood of an electrical short between the upper copper line and the bottom electrode of the RRAM pillar. Dielectric spacers are therefore often formed on sidewalls of the RRAM pillar to prevent the upper copper line from electrically contacting the bottom electrode of the RRAM pillar. However, conventional sidewall spacers are often damaged during etching used to form a via opening, thereby creating an undesirable weak spot for TiN wet etching. This causes yield loss for the RRAM crossbar array.

Figure 3:
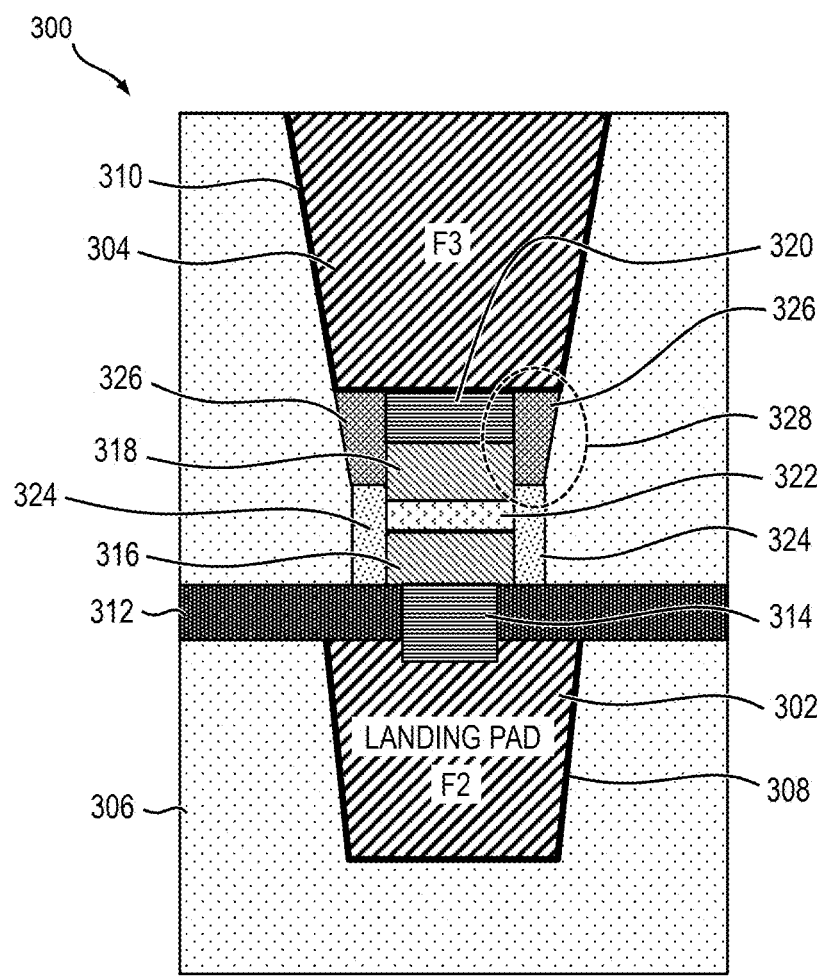
FIG. 3 is a cross-sectional view depicting at least a portion of an exemplary RRAM pillar integrated with corresponding copper lines, according to an embodiment of the present invention.

Embodiments of the invention provide a novel RRAM pillar structure that beneficially eliminates at least the above-noted challenges to integration of RRAM with copper damascene processing. With reference now to FIG. 3, a cross-sectional view depicts at least a portion of an exemplary RRAM pillar structure 300 integrated with corresponding copper lines, according to an embodiment of the invention. The RRAM pillar structure 300 may be disposed, for example, in an RRAM area of a crossbar array. The RRAM pillar structure 300 includes a lower metal line (F2) 302, which comprises copper in one or more embodiments, and an upper metal line (F3) 304, which also comprises copper in one or more embodiments, and an RRAM pillar (i.e., stack) disposed between the lower and the upper metal lines as shown. The lower metal line 302 and the upper metal line 304, which may be formed using copper damascene processing, are surrounded by a dielectric layer 306, which in one or more embodiments is an interlayer dielectric (ILD) layer. The dielectric layer 306 may comprise, for example, silicon dioxide or an alternative low-k material.

In the context of copper damascene processing, each of the lower metal line 302 and the upper metal line 304 is preferably surrounded by a barrier layer 308 and 310, respectively, to prevent copper from diffusing into the surrounding dielectric layer 306. The barrier layer 308, 310 preferably comprises, for example, tantalum (Ta), tantalum nitride (TaN), TiN, etc., although embodiments of the invention are not limited to any specific barrier material.

An encapsulation layer 312 (e.g., silicon nitride (SiN)) is deposited over the lower metal line 302, and preferably extending laterally across the structure, although not explicitly shown in FIG. 3. Openings are then etched through the encapsulation layer 312 in prescribed areas to expose the underlying lower metal line 302. The RRAM pillar is formed on top of a corresponding opening in the encapsulation layer 312 on at least a portion of an upper surface of the lower metal line 302.

In one or more embodiments, the RRAM pillar comprises a multi-layer bottom electrode and a multi-layer top electrode. In some preferred embodiments, the top and bottom electrodes of the RRAM pillar are bi-layer electrodes, although embodiments of the invention are not limited to electrodes having two layers. Specifically, the bottom electrode of the RRAM pillar comprises a first metal or metal nitride layer 314, which may be TaN in this example, formed directly on an upper surface of the lower metal line 302, and a second metal/metal nitride layer 316, which may be TiN in this example, formed on an upper surface of the first metal nitride layer. Similarly, the top electrode of the RRAM pillar in this illustrative embodiment comprises a first metal or metal nitride layer 318, which may be TiN in this example, and a second metal/metal nitride layer 320, which may be TaN in this example. The second metal/metal nitride (TaN) layer 320 is in direct electrical contact with the upper metal line 304. It is to be appreciated that all material layers forming the top and bottom electrodes of the RRAM pillar need not comprise a metal nitride. For example, in one or more embodiments, at least one of the layers forming the top electrode comprises TiN and the other layer of the top electrode comprises a metal, such as tungsten (W), iridium (Jr), etc.

The RRAM pillar further includes a metal oxide layer 322 disposed between the bottom and top electrodes. More particularly, the metal oxide layer 322 is formed on at least a portion of an upper surface of the second metal nitride layer 316 of the bottom electrode, and the first metal nitride layer 318 of the top electrode is formed on at least a portion of an upper surface of the metal oxide layer 322. The metal oxide layer 322 used as the resistive switching material, in one or more embodiments, comprises hafnium oxide (HfO), although embodiments of the invention are not limited to this specific resistive switching material.

Dielectric spacers 324 are preferably formed on sidewalls of the RRAM pillar, covering at least the TiN layer 316 of the bottom electrode of the RRAM pillar. The sidewall spacers 324, which in one or more embodiments comprise silicon nitride (SiN), do not adequately protect the RRAM pillar during formation of the upper metal line 304. Consequently, a passivation layer 326 is formed on the sidewall spacers 324 covering at least a portion of the multi-layer top electrode 318, 320. The sidewall spacers 324 are configured so that the passivation layer 326 does not make contact with (i.e., is electrically isolated from) the metal oxide layer 322 or the multi-layer bottom electrode 314, 316 of the RRAM pillar.

As shown in the indicated area of interest 328, the passivation layer 326 is self-aligned with the upper metal line 304, so that the edges of the upper metal line cannot extend beyond the passivation layer and wrap around the RRAM pillar, thereby creating an electrical short with the bottom electrode of the RRAM pillar. The self-aligned passivation layer 326, in one or more embodiments, comprises a dielectric material. In alternative embodiments, since the passivation layer 326 does not come into electrical contact with the metal oxide layer 322 or the multi-layer bottom electrode 314, 316 of the RRAM pillar, the passivation layer may comprise a metal or another conductive material. The upper metal line 304 is formed on, and is self-aligned with, the passivation layer 326 and on an upper surface of the second metal nitride layer 320 of the multi-layer top electrode of the RRAM pillar.

Thus, in contrast to conventional RRAM device fabrication approaches, the RRAM pillar structure 300 according to one or more embodiments of the invention beneficially provides a self-aligned passivation layer, formed after via lithography and etching (for connecting the lower and upper metal lines in a periphery region of the wafer in which the RRAM structure is formed), that protects the bottom electrode 314, 316 of the RRAM pillar from electrically contacting the upper metal line 304. This unique arrangement advantageously enables scaling of the RRAM pillar size to less than the upper metal contact size without risk of an electrical short occurring.

By way of example only and without limitation, FIGS. 4 through 26 are cross-sectional views depicting illustrative processing steps/stages in the fabrication of an exemplary RRAM structure providing reduced connection resistance, according to embodiments of the invention. Although the overall fabrication method and the structures formed thereby are entirely novel, certain individual processing steps required to implement the method may incorporate conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated herein by reference in their entireties for all purposes. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such integrated circuit devices may not be explicitly shown in a given figure to facilitate a clearer description. This does not imply that the semiconductor layer(s) not explicitly shown are omitted in the actual integrated circuit device.

Figure 4:
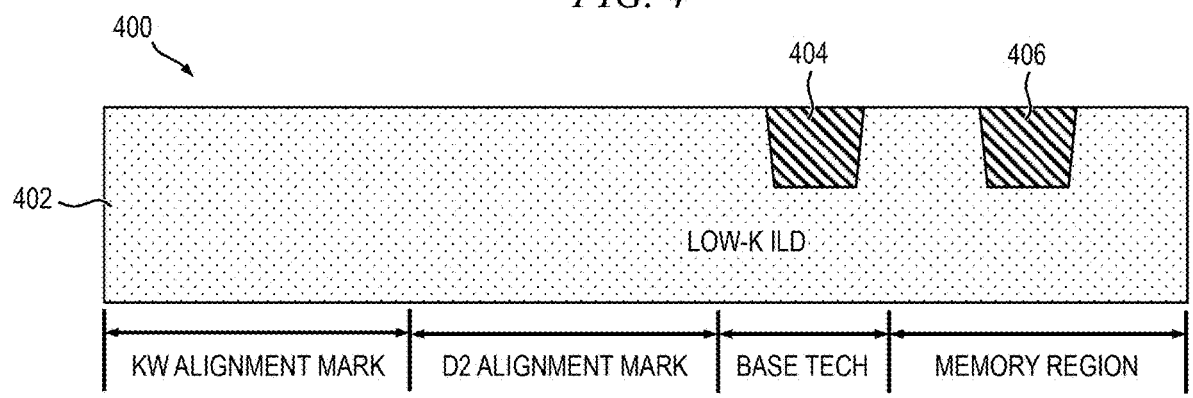

FIG. 4 is a cross-sectional viewing depicting at least a portion of an exemplary semiconductor structure 400 in which lower metal lines are formed. Specifically, the structure 400 includes a dielectric layer 402, which is preferably a low-k ILD layer. Lower metal lines 404 and 406 are formed in the ILD layer 402, such as by using standard photolithographic patterning and etching processes. In this illustration, the structure 400 is divided into various regions, including a first (e.g., KW) alignment mark region, a D2 alignment mark region, a base technology region (where peripheral circuitry is primarily formed) and a memory region (where the RRAM cell(s) are formed). In one or more embodiments of the invention, the lower metal lines 404, 406 comprise copper, as may be formed by copper damascene processing. In the context of copper damascene processing, a barrier layer is generally formed surrounding the copper lines 404, 406 to prevent copper from diffusing into the surrounding ILD layer 402.

Figure 5:
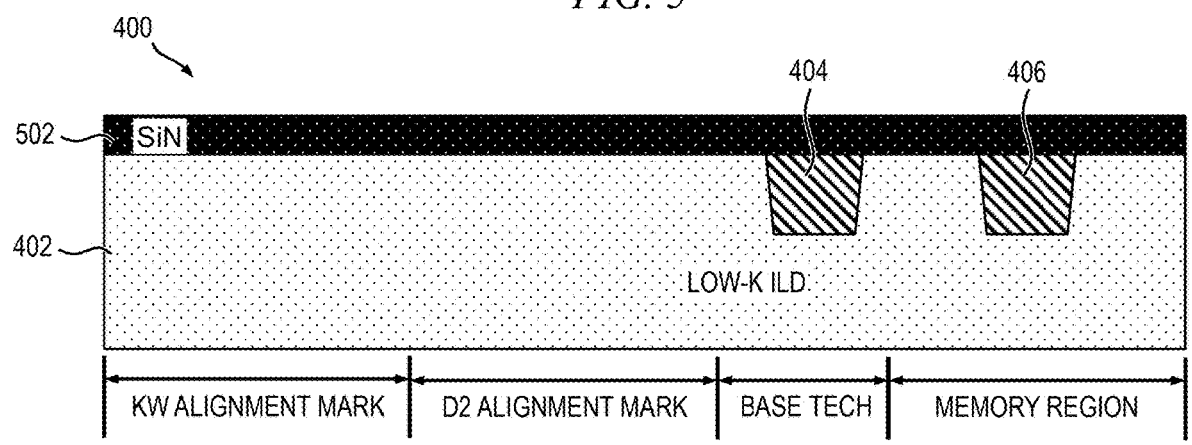

FIG. 5 depicts the formation of a capping (i.e., encapsulation) layer 502, which in one or more embodiments comprises SiN, over at least a portion of an upper surface of the structure 400. Specifically, the capping layer 502 is preferably formed on an upper surface of the lower copper lines 404, 406 and on at least a portion of the upper surface of the ILD layer 402 using a deposition process (e.g., chemical vapor deposition (CVD)), although embodiments of invention are not limited to any particular process of forming the capping layer.

In FIG. 6, an organic dielectric layer (ODL) 602 is formed on at least a portion of an upper surface of the capping layer 502. The organic dielectric layer 602, in one or more embodiments, is formed having a thickness of about 135 nanometers (nm) using a standard deposition process such as, for example, chemical vapor deposition (CVD), although embodiments of the invention are not limited to any specific thickness or deposition process for forming the organic dielectric layer 602. An anti-reflective coating (ARC) layer 604 is formed on at least a portion of an upper surface of the organic dielectric layer 602. A photoresist mask 606 is formed on at least a portion of an upper surface of the ARC layer 604. The structure 400 is then subjected to an optical lithography process whereby a prescribed pattern is transferred to the photoresist mask 606 through exposure to light or another optical source. One or more openings, 608 and 610, are then formed in the photoresist mask 606 (e.g., by etching) to define areas of the structure 400 to be subsequently removed. One of the openings 608 is formed over the D2 alignment mark region and another opening 610 is formed over the memory region and aligned with the lower copper line 406. Selective etching is then performed to remove the portions of the capping layer 502 directly beneath the openings 608, 610.

With reference now to FIG. 7, openings 702 and 704 are etched through the SiN capping layer 502. A first one of the openings 702 is etched in the D2 alignment mark region, through the ARC layer 604, the organic dielectric layer 602 and at least partially into the ILD layer 402, to expose the underlying ILD layer 402. Similarly, a second one of the openings 704 is etched in the memory region, through the ARC layer 604, the organic dielectric layer 602 and at least partially into the lower copper line 406 to thereby expose the underlying lower copper line; in this instance, the lower copper line 406 serves as a landing pad for the RRAM pillar formed subsequently thereon. In one or more embodiments, reactive ion etching (RIE) is used to etch the openings 702, 704, although the invention is not limited to RIE. After formation of the openings 702, 704, the photoresist mask 606, the ARC layer 604 and the organic dielectric layer 602 are removed, such as by wet etching.

Figure 8:
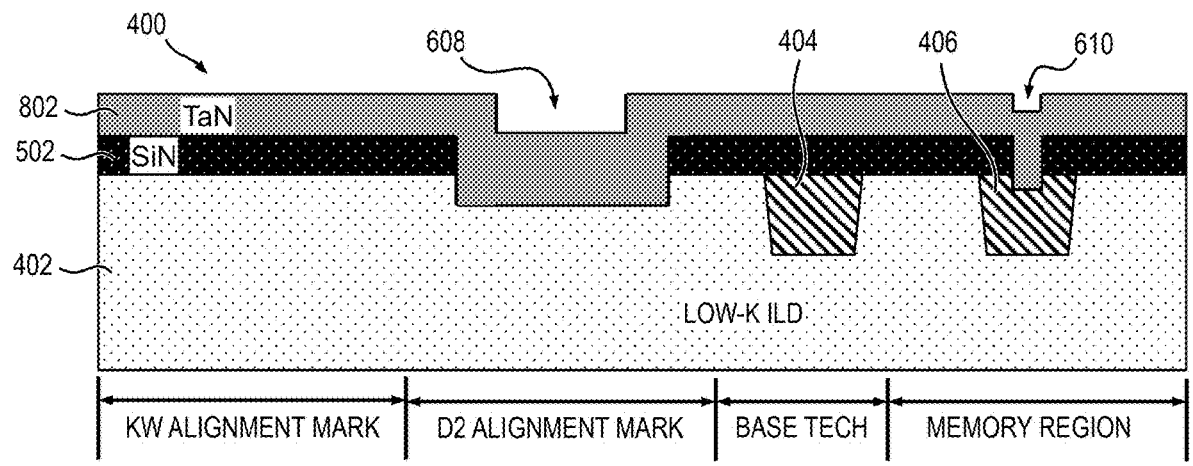
Figure 9:
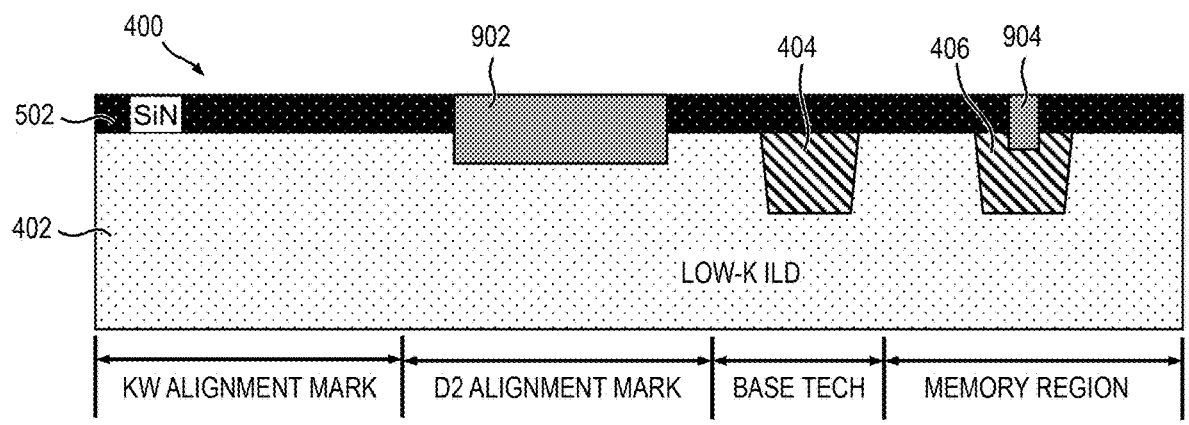

A metal nitride liner 802 is formed on an upper surface of the structure 400, including in the openings 702, 704, as shown in FIG. 8. In one or more embodiments, the metal nitride liner 802 comprises TaN, although embodiments of the invention are not limited to TaN. The metal nitride liner 802 is preferably formed using a deposition process, such as, but not limited to, plasma vapor deposition (PVD). In FIG. 9, the upper surface of the structure 400 is planarized using, for example, chemical-mechanical planarization (CMP), such that portions of the metal nitride liner 802 lying outside of the openings 702, 704 on the upper surface of the capping layer 502 are removed to form metal nitride plugs 902 and 904. Metal nitride plug 904 is in direct electrical contact with the underlying lower copper line 406 and will become one of the layers in a multi-layer bottom electrode of the RRAM pillar subsequently formed on top of the lower copper line 406, as will be described in further detail herein below.

Figure 10:
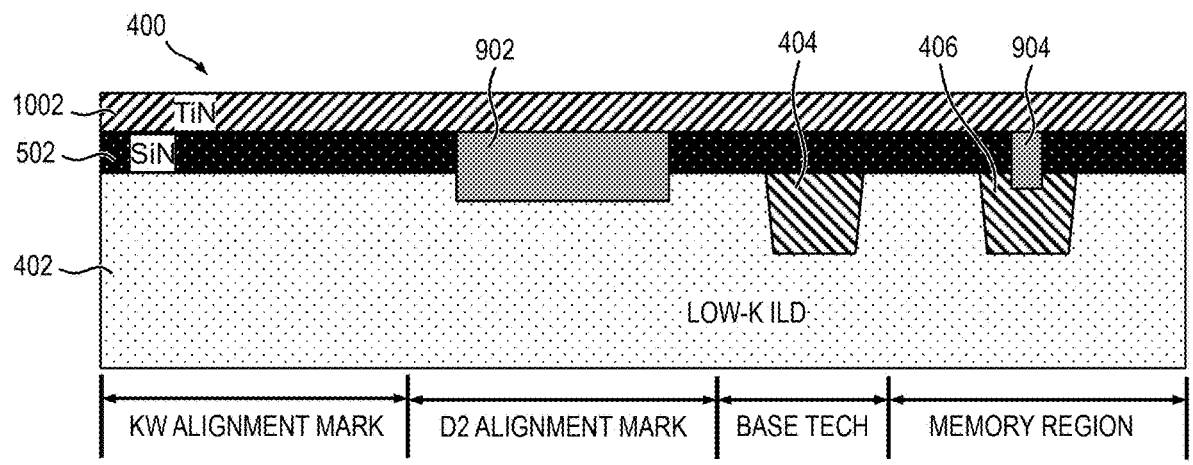

FIG. 10 depicts a step of forming a second metal nitride layer 1002 on at least a portion of an upper surface of the structure 400, including over the capping layer 502 and metal nitride plugs 902 and 904. In one or more embodiments, the second metal nitride layer 1002 comprises TiN, although embodiments of the invention are not limited to TiN. The second metal nitride layer 1002, in conjunction with the metal nitride plug 904, will form a bottom electrode of the RRAM pillar structure subsequently formed.

Figure 11:
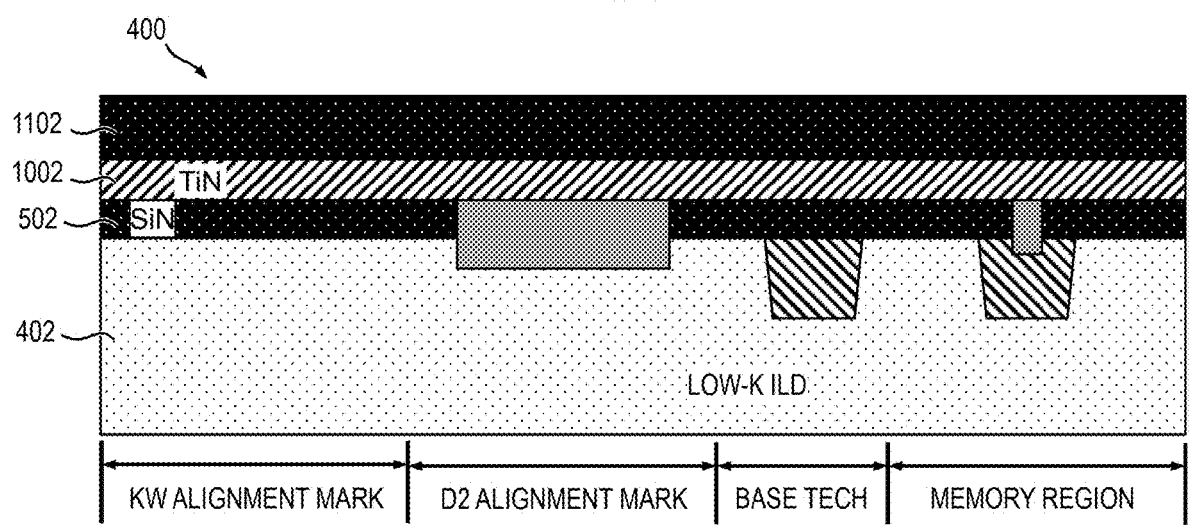
Figure 12:
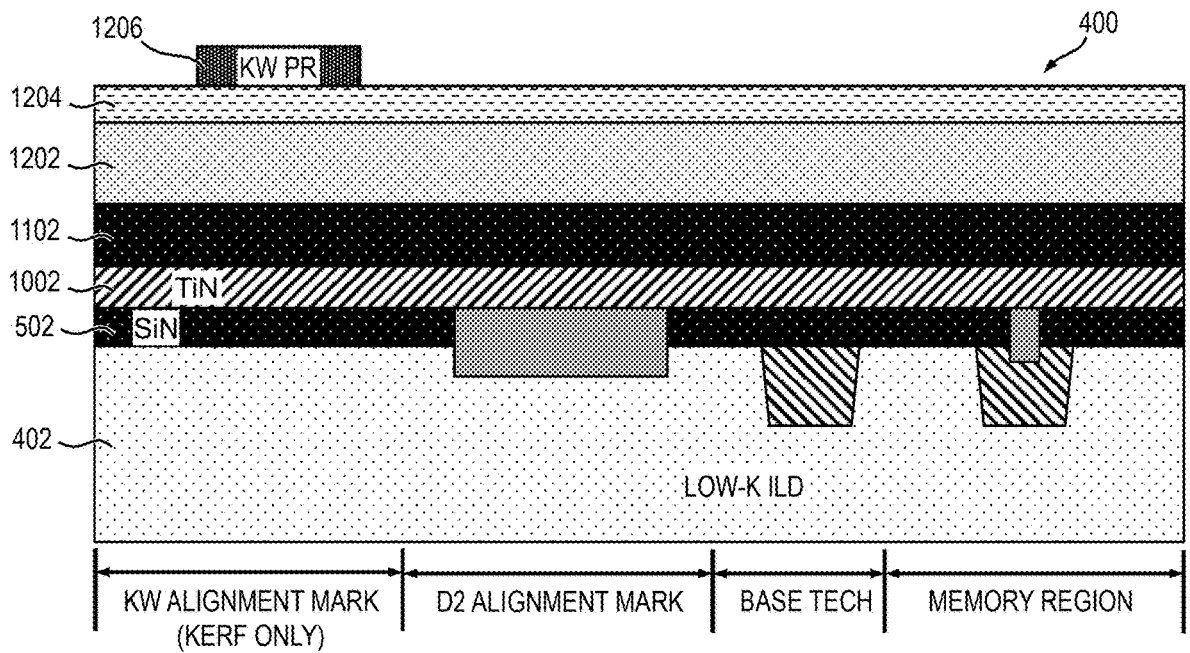
Figure 13:
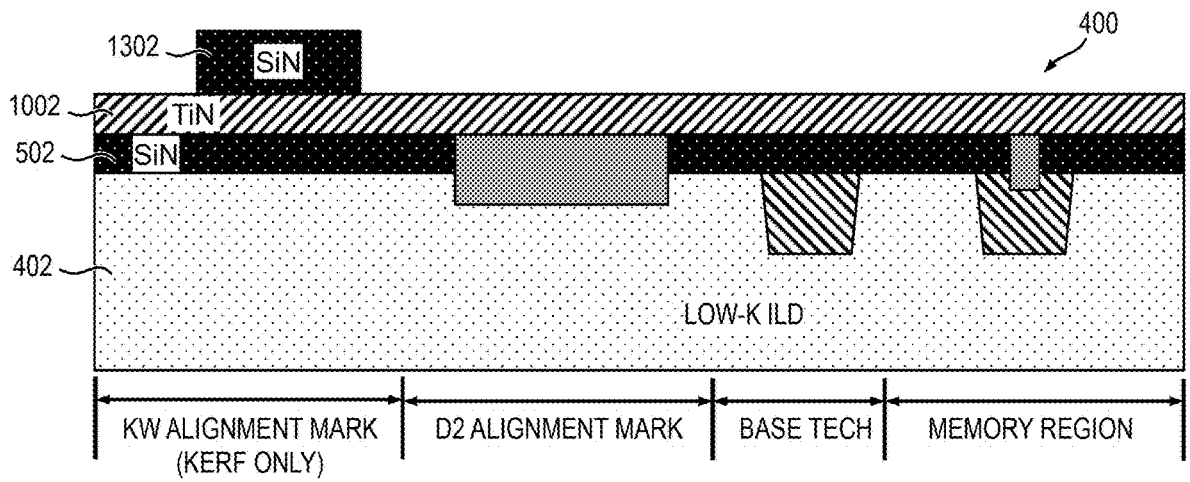

FIGS. 11-13 depict exemplary semiconductor fabrication steps for optionally forming a kerf alignment structure. With reference to FIG. 11, a hardmask layer 1102 is preferably deposited on at least a portion of an upper surface of the second metal nitride layer 1002 using, for example a CVD process. In FIG. 12, an organic dielectric layer (ODL) 1202 is formed on at least a portion of an upper surface of the hardmask layer 1102. In one or more embodiments, the organic dielectric layer 1202 is formed having a thickness of about 100 nm using a standard deposition process such as, for example, CVD, although embodiments of the invention are not limited to any specific thickness or deposition process for forming the organic dielectric layer 1202. Next, an ARC layer 1204 corresponding to an alignment mark in another level is formed on at least a portion of an upper surface of the organic dielectric layer 1202, such as by using a standard CVD or similar process. A photoresist layer 1206 is formed on at least a portion of an upper surface of the ARC layer 1204. The photoresist layer 1206 is patterned, for example using standard photolithographic processing, and etched (e.g., using RIE) so that only a portion of photoresist layer remains in the KW alignment mark region of the structure 400. After selective etching down to the second metal nitride layer 1002, and removal of the photoresist layer 1206, ARC layer 1204 and organic dielectric layer 1202 (e.g., using a plasma or wet etch), a hardmask structure 1302 (which is a portion of the hardmask layer 1102 shown in FIG. 12) underlying the photoresist layer (1206 in FIG. 12) will remain in the KW alignment mark region of the structure 400, as shown in FIG. 13.

Figure 14:
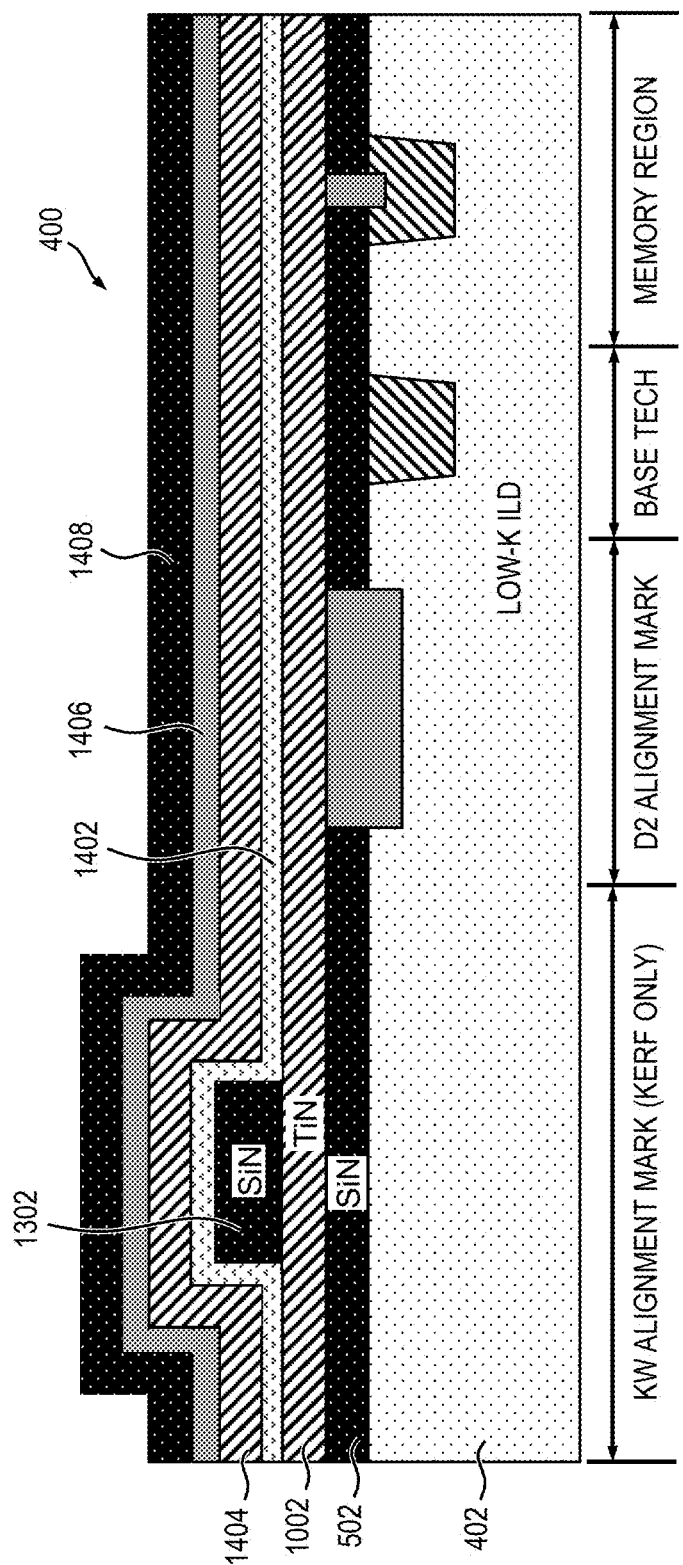

FIG. 14 depicts a process for forming the remaining layers of the RRAM pillar. More particularly, a metal oxide layer 1402 is formed on at least a portion of the structure 400, including an upper surface of second metal nitride layer 1002 forming the RRAM pillar bottom electrode, and surrounding the hardmask structure 1302. The metal oxide layer 1402, which is employed as the resistive switching material of the RRAM pillar, comprises HfO in one or more embodiments, although embodiments of the invention are not limited to this specific resistive switching material. A third metal nitride layer 1404 is formed on at least a portion of an upper surface of the metal oxide layer 1402, and a fourth metal nitride layer 1406 is formed on at least a portion of an upper surface of the third metal nitride layer 1404. The third and further metal nitride layers 1404 and 1406, which in one or more embodiments comprises TiN and TaN, respectively, will form a multi-layer top electrode of the RRAM pillar. The metal oxide layer 1402 and third and further metal nitride layers may be formed using a standard deposition process, such as, for example, CVD.

With continued reference to FIG. 14, a second hardmask layer 1408 is formed over the upper surface of the structure 400. Like the first hardmask layer 502/1302, the second hardmask layer 1408, in one or more embodiments, comprises SiN, although embodiments of the invention are not limited to this specific material. As apparent from FIG. 14, the presence of the first hardmask structure 1302 creates a stepped cross-sectional profile in the KW alignment mask region of the structure 400; this topography is used for alignment in one or more embodiments.

Figure 15:
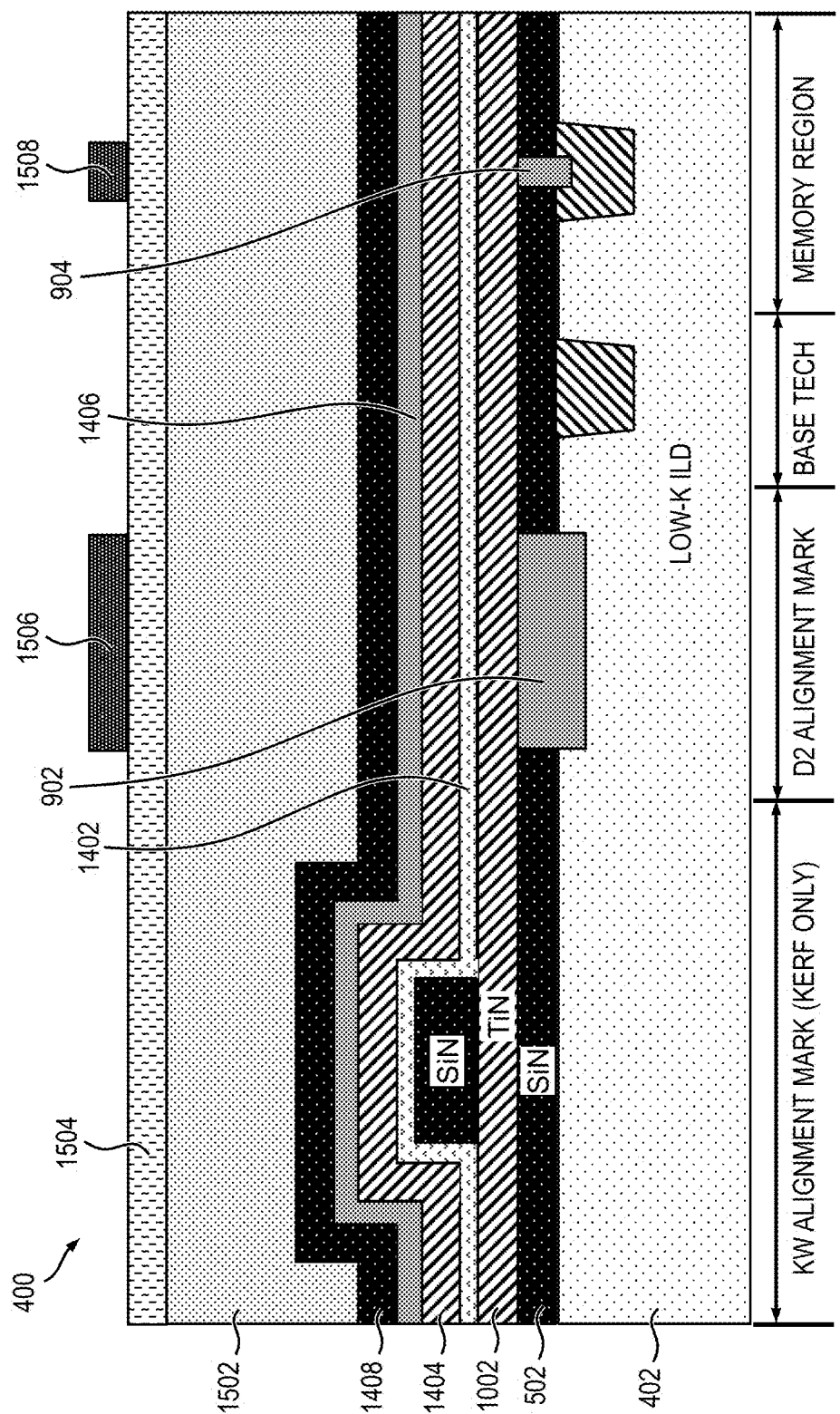
Figure 16:
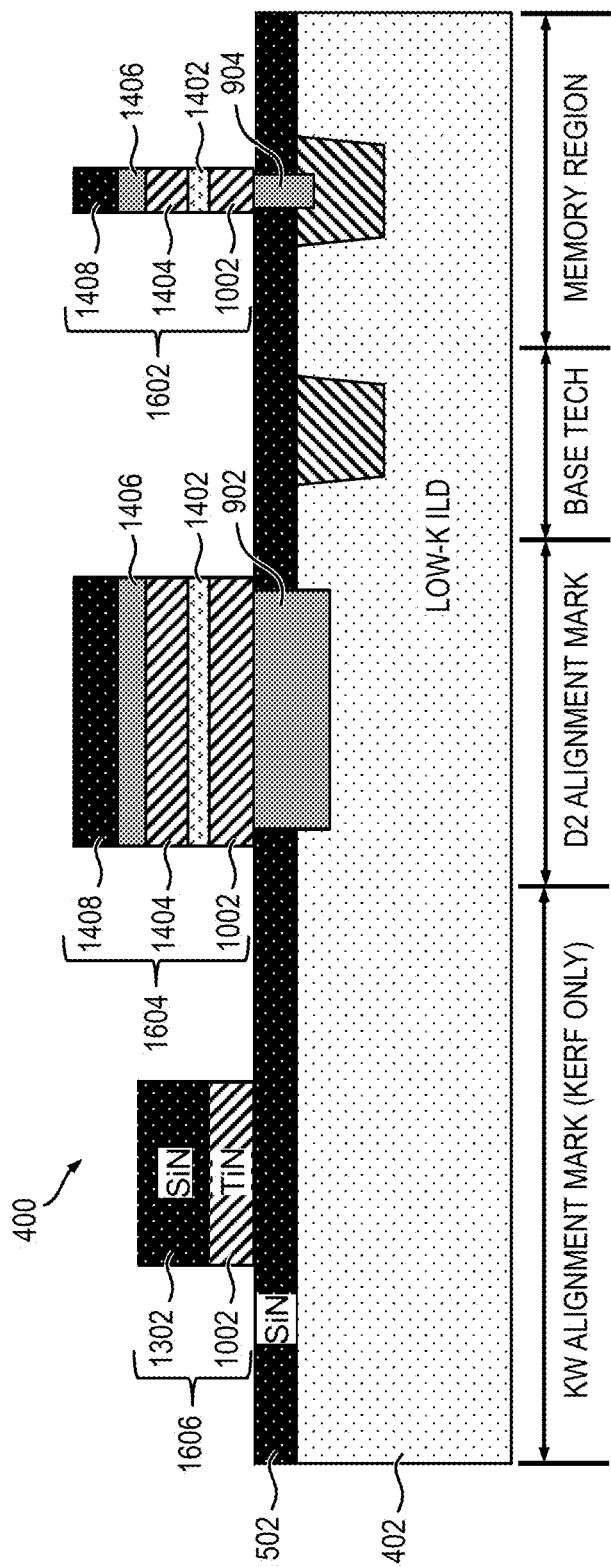

FIGS. 15 and 16 depict illustrative steps in the formation of the RRAM pillar, according to an embodiment of the invention. As shown in FIG. 15, a third organic dielectric layer 1502 is formed on at least a portion of an upper surface of the second hardmask layer 1408 such as by using a standard deposition process (e.g., CVD, PVD, plasma-enhanced chemical vapor deposition (PECVD), atomic layer deposition (ALD), etc.). In one or more embodiments, the third organic dielectric layer 1502 is formed having a cross-sectional thickness of about 200 nm, although embodiments of the invention are not limited to any specific thickness. CMP or the like is preferably performed on the third organic dielectric layer 1502 in order to planarize the upper surface of the structure 400. Then, a third ARC layer 1504 is formed on at least a portion of an upper surface of the third organic dielectric layer 1502 using, for example, a standard deposition process.

A photoresist layer is deposited on an upper surface of the third ARC layer 1504. This photoresist layer is then patterned, using photolithographic processing, and etched to form photoresist structures 1506 and 1508. The photoresist structures 1506 and 1508 are aligned with the underlying metal nitride plugs 902 and 904, respectively.

In FIG. 16, selective etching is performed, such as RIE, to form an RRAM pillar 1602 in the memory region, and alignment structures 1604 and 1606 in the D2 alignment mark and KW alignment mark regions, respectively. Specifically, in one or more embodiments, RIE is performed to etch through the third ARC layer 1504, third organic dielectric layer 1502, second hardmask layer 1408, fourth metal nitride layer 1406, third metal nitride layer 1404, metal oxide layer 1402, and second metal nitride layer 1002. The resulting RRAM pillar 1602 and alignment structures 1604, 1606, after removing the remaining photoresist structures 1506 and 1508, the third ARC layer 1504 and the third organic dielectric layer 1502 (see FIG. 15), are illustrated in FIG. 16.

Figure 17:
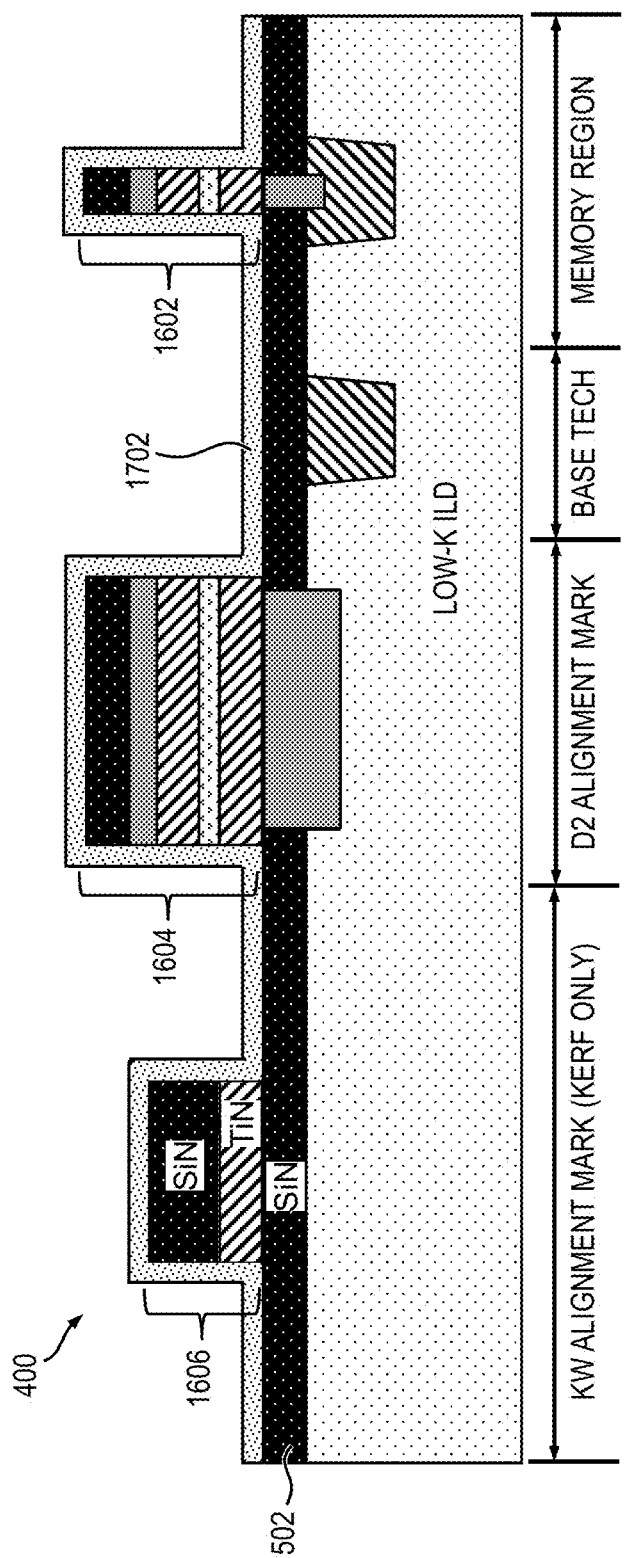
Figure 18:
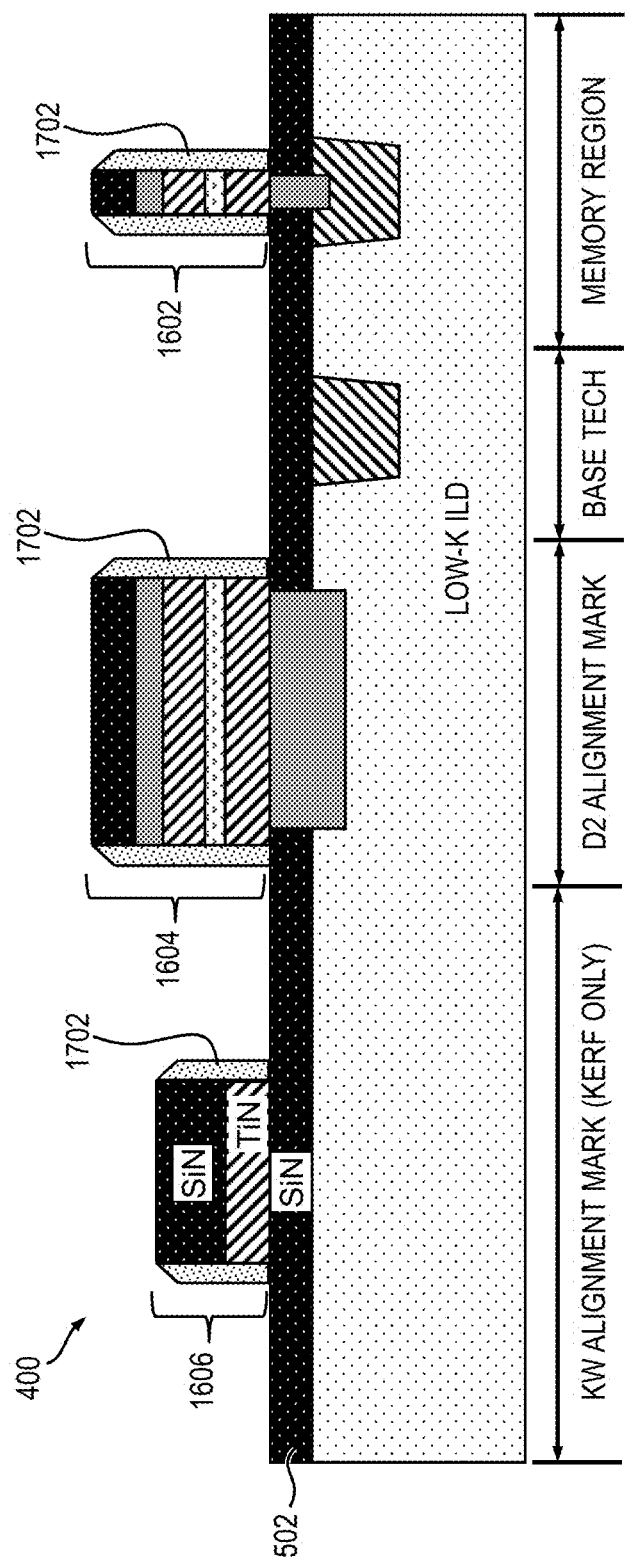

An encapsulation layer 1702 is formed over the structure 400, including a top surface and sidewalls of the RRAM pillar 1602 and a top surface and sidewalls of the alignment structures 1604 and 1606, as depicted in FIG. 17. In one or more embodiments, the encapsulation layer 1702 comprises SiN, although other insulating (i.e., dielectric) materials for forming the encapsulation layer are similarly contemplated by embodiments of the invention. Selective etching, such as, for example, RIE, is then performed to remove the encapsulation layer 1702 disposed on horizontal surfaces of the structure 400, including on the top surfaces of the RRAM pillar 1602, alignment structures 1604, 1606, and the upper surface of the capping layer 502 between the adjacent structures, as illustrated in FIG. 18. Thus, the encapsulation layer 1702 will remain only on the vertical sidewalls of the RRAM pillar 1602 and alignment structures 1604, 1606 to form sidewall spacers.

Figure 19:
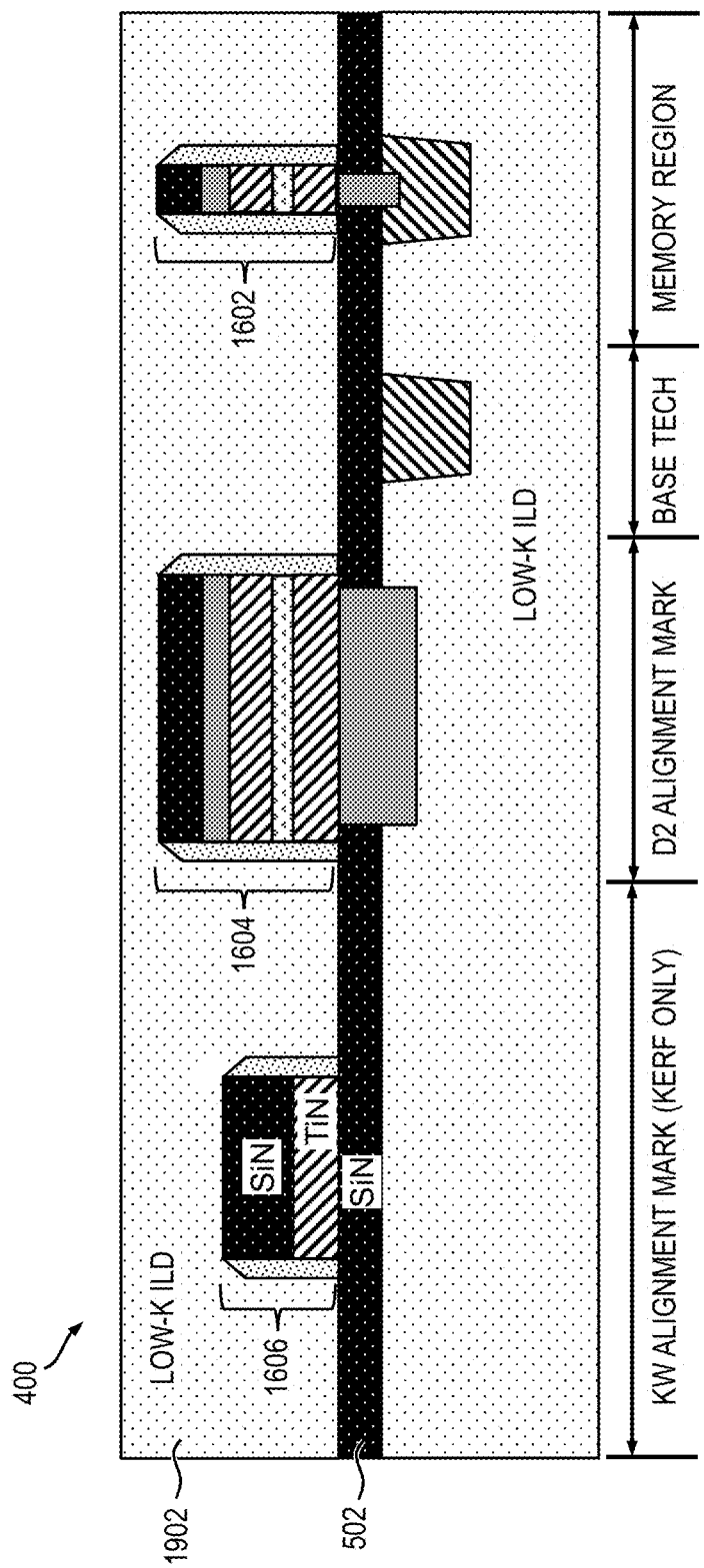

In FIG. 19, a dielectric layer 1902 is deposited on at least a portion of the upper surface of the structure 400, including on the upper surface of the capping layer 502 and surrounding the RRAM pillar 1602 and alignment structures 1604, 1606. In one or more embodiments, the dielectric layer 1902 is a low-k ILD layer. CMP or an alternative planarization process is then performed to planarize the upper surface of the dielectric layer 1902. Upper metal wiring (F3) will be subsequently formed in this dielectric layer 1902, as will be described in further detail herein below.

Figure 20:
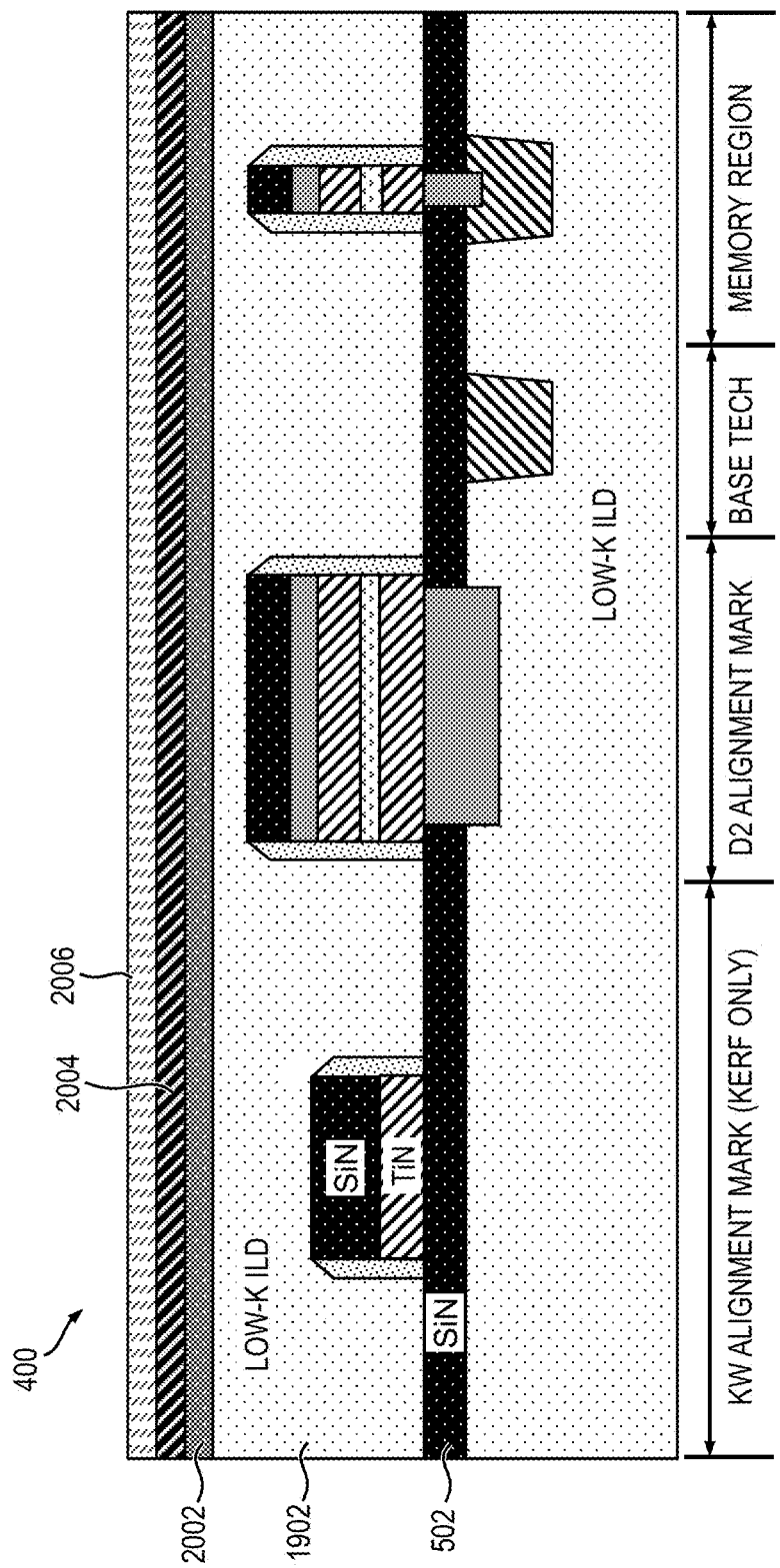
Figure 21:
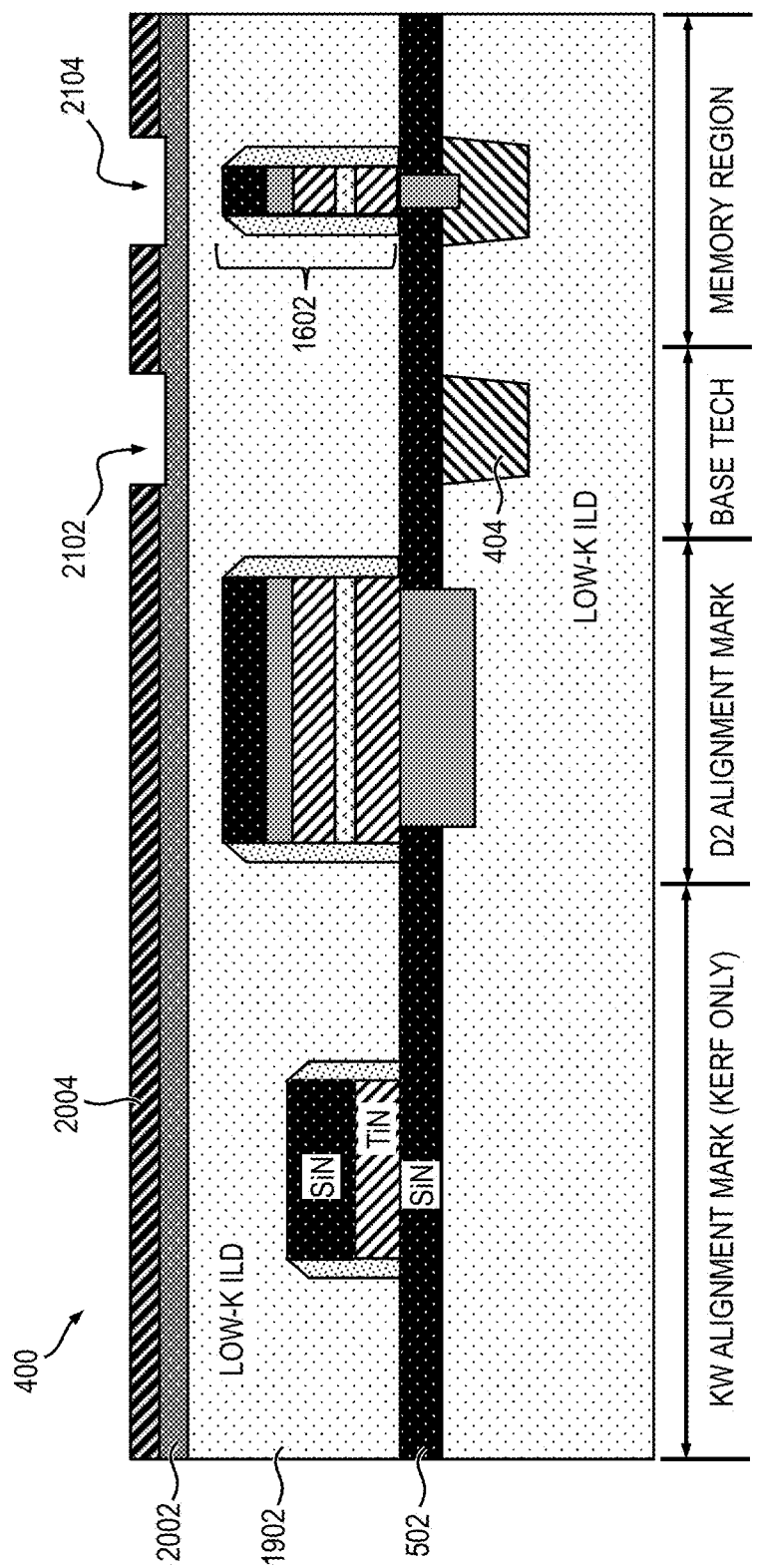

As shown in FIG. 20, in forming the upper metal wiring layer (F3), a sacrificial SiN layer 2002 is deposited on an upper surface of the dielectric layer 1902. A metal nitride (e.g., TiN) hardmask layer 2004 is then deposited on an upper surface of the sacrificial SiN layer 2002, and a tetraethyl orthosilicate (TEOS) layer 2006 is deposited on an upper surface of the TiN hardmask layer. One or more of the SiN layer 2002, TiN hardmask layer 2004 and TEOS layer 2006 may be deposited using, for example, a CVD or PECVD process. In FIG. 21, the TEOS layer 2006 is patterned and, using standard photolithography and etching, openings 2102 and 2104 are formed in the TiN hardmask layer 2004 to expose a portion of the sacrificial SiN layer 2002 therethrough. A first one of the openings 2102 is aligned vertically with the underlying lower metal line 404, and a second one of the openings 2104 is aligned vertically with the underlying RRAM pillar 1602.

Figure 22:
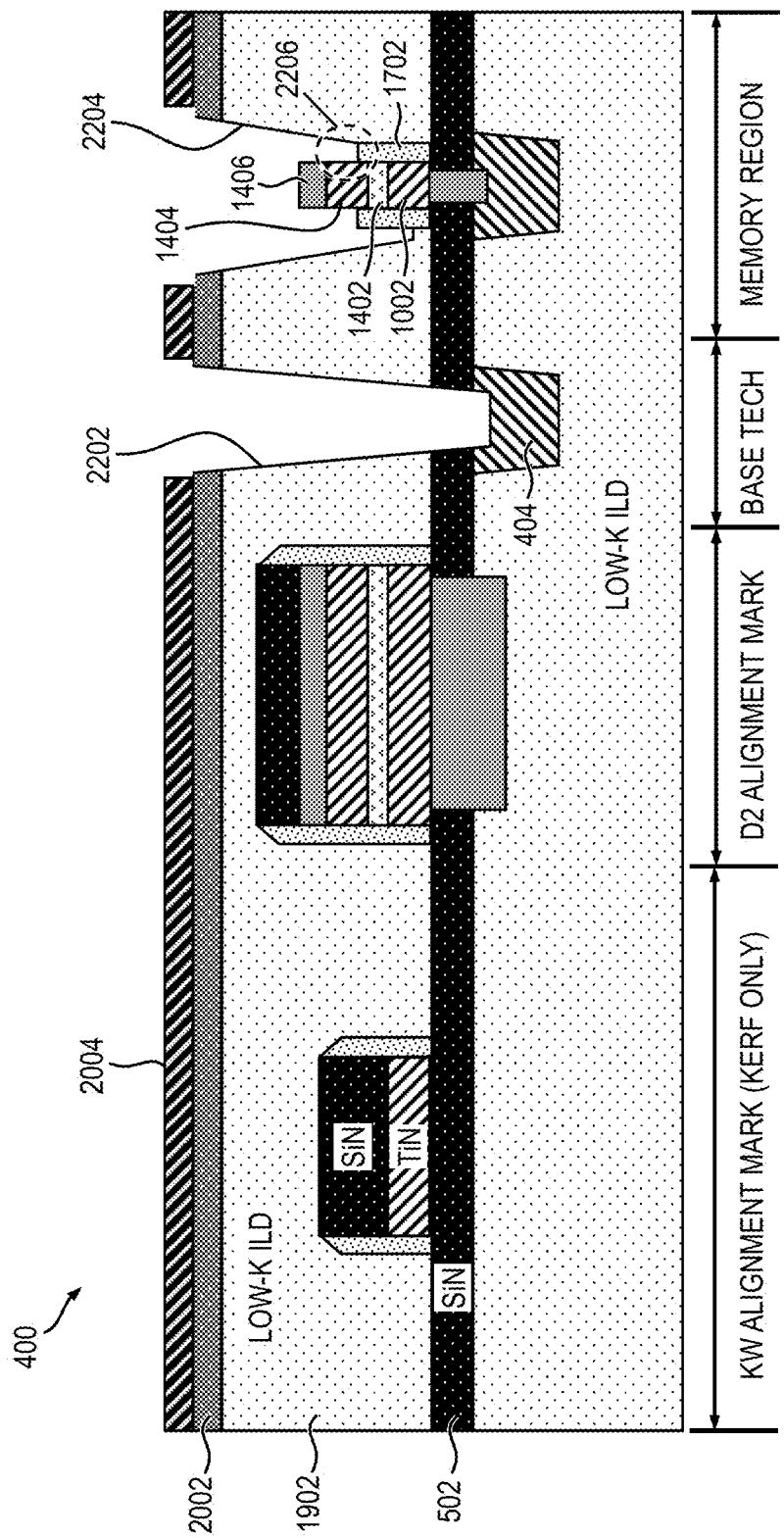

With reference now to FIG. 22, deep RIE, or similar selective etching, is performed for forming trenches 2202 and 2204. Trench 2202 is etched through the sacrificial SiN layer 2002, the low-k dielectric layer 1902 and the capping layer 502 to expose at least a portion of the lower copper line 404. This trench 2202 will form a via which electrically connects the lower copper line 404 with a corresponding upper copper line to be formed in the base technology region of the structure 400. Similarly, trench 2204 is etched through the sacrificial SiN layer 2002 and partially through the low-k dielectric layer 1902 to expose the top electrode, comprised of third and further metal nitride layers 1404 and 1406, respectively, of the RRAM pillar in the memory region of the structure 400.

Due to the deep RIE used to form trench 2202, there will be a large amount of over-etch in the trench 2204 which can significantly erode the encapsulation layer 1702 forming sidewall spacers for protecting the RRAM pillar. Erosion of the encapsulation layer 1702 protecting the RRAM pillar is shown in area 2206. This erosion creates a high risk of electrical shorting between a corresponding upper copper line to be formed and the metal oxide switching layer 1402 and bottom electrode of the RRAM pillar, which comprises second metal nitride layer 1002.

Figure 23:
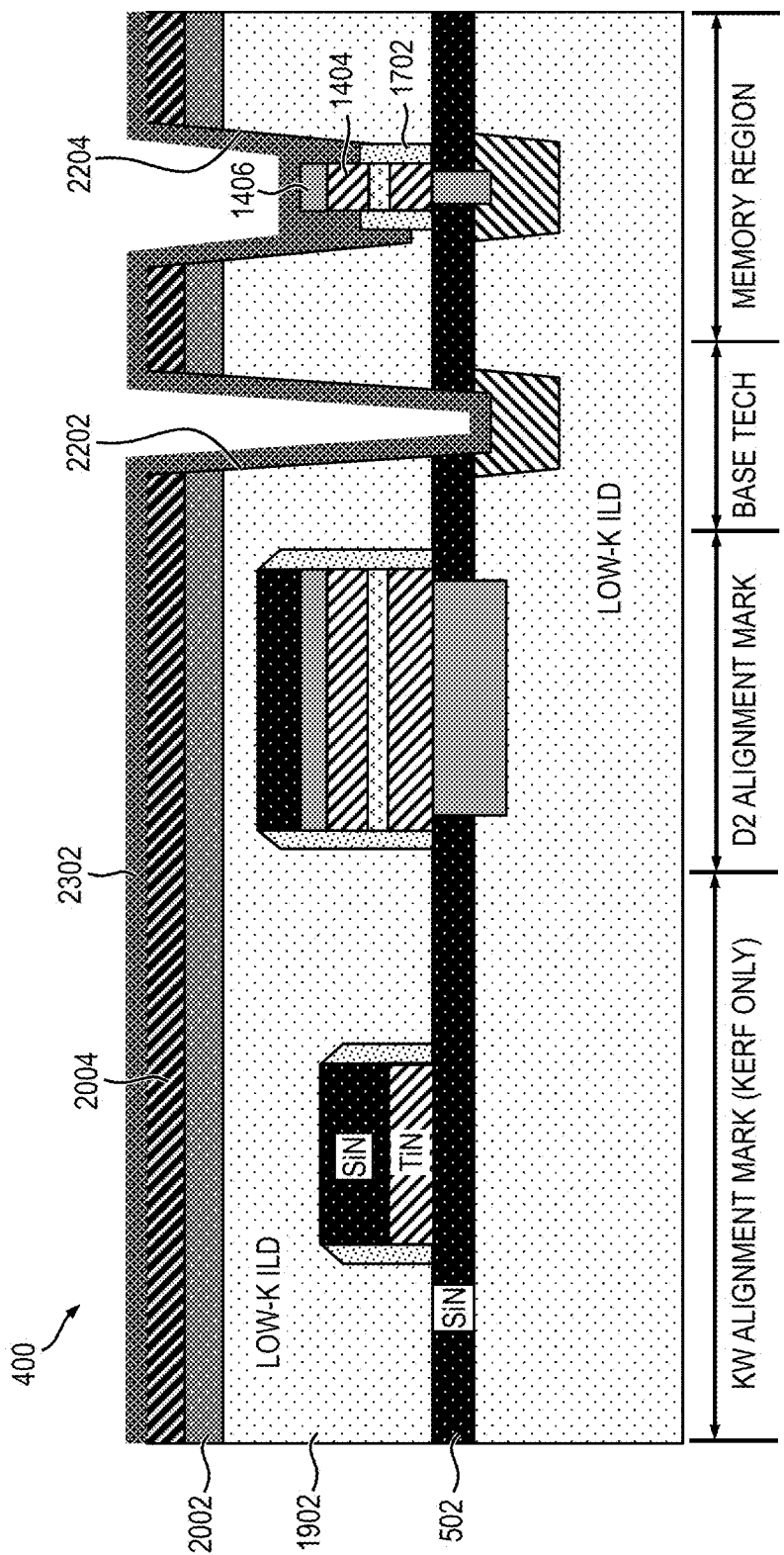

In order to eliminate, or at least substantially reduce, the risk of shorting between the upper copper line and the bottom electrode of the RRAM pillar, a conformal dielectric liner (i.e., passivation layer) 2302 is deposited on the upper surface of the structure 400, including on an upper surface of at least a portion of the TiN hardmask layer 2004, sidewalls of the trenches 2202 and 2204, and surrounding at least a portion of the RRAM pillar, as shown in FIG. 23. It is to be appreciated that the small spaces proximate the encapsulation layer 1702 forming sidewall spacers of the RRAM pillar will also be completely filled with the dielectric liner 2302. The dielectric liner 2302 may comprise, for example, silicon carbide (SiC), silicon carbonate (SiCO), $SiO_2$, etc., although embodiments of the invention are limited to any specific dielectric liner material.

Figure 24:
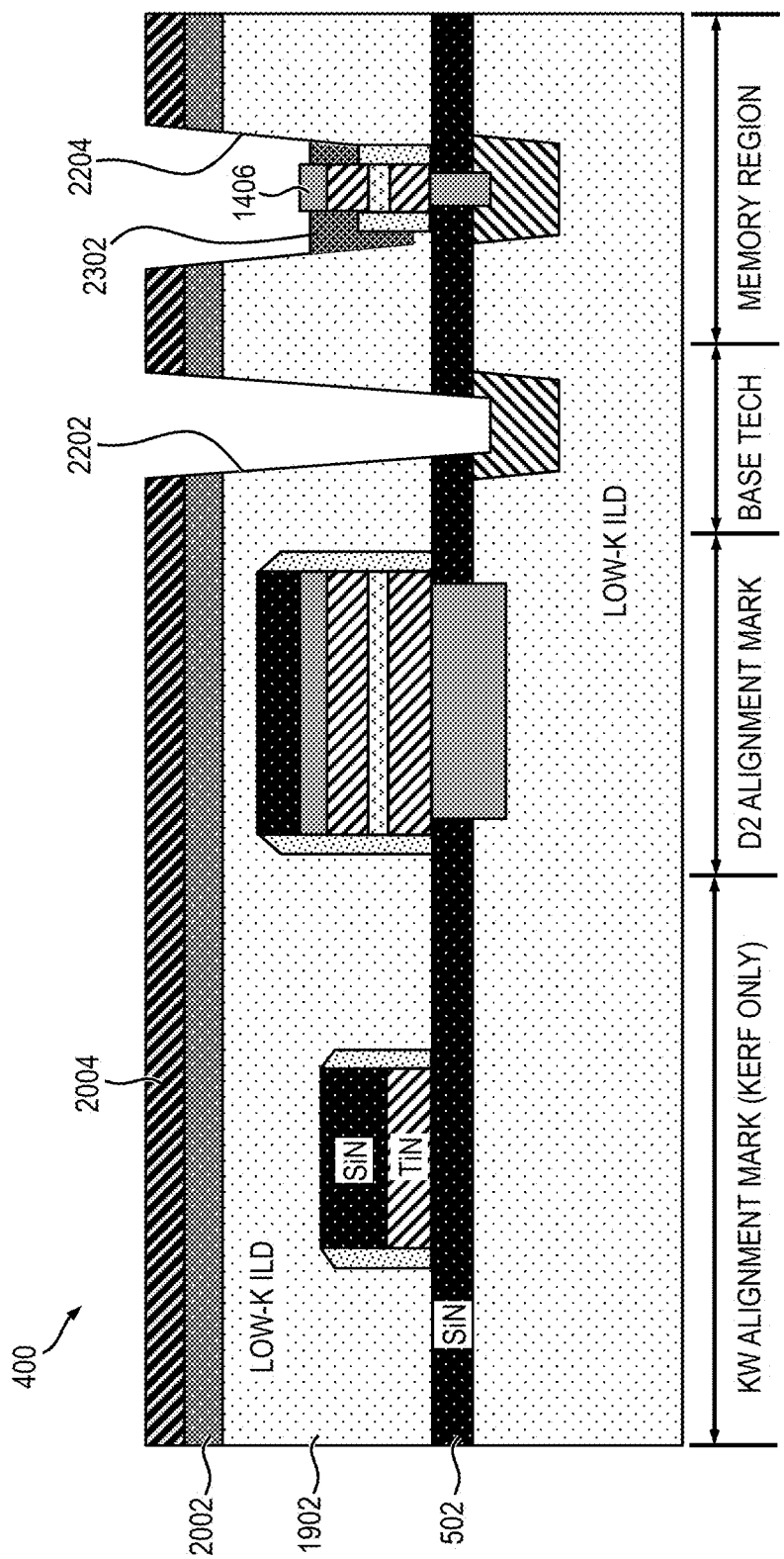

FIG. 24 depicts the illustrative structure 400 after performing an isotropic etch-back of the conformal dielectric liner 2302, according to one or more embodiments of the invention. As apparent from FIG. 24, the isotropic etch-back process will remove the conformal dielectric liner 2302 on the upper surface of the hardmask layer 2004, on the sidewalls and bottom of trench 2202, and in an open region on at least a portion of the sidewalls of trench 2204. The conformal dielectric liner 2302 will remain in the pinched-off region between the RRAM pillar and the trench 2204 to leave only a portion of the fourth metal nitride layer 1406 forming an upper surface of the top electrode of the RRAM pillar exposed in the trench. This conformal dielectric liner 2302 will protect the RRAM pillar switching material and bottom electrode from shorting with the upper copper line to be formed in the trench 2204. Following the isotropic etch-back process, at least a portion of an upper surface of the top electrode 1406 of the RRAM pillar is exposed in the trench through a recessed conformal dielectric liner 2302. In one or more embodiments, the isotropic etch-back is performed by atomic layer etching (ALE) to achieve accurate etch control, although embodiments of the invention contemplate essentially any isotropic dry or wet etch process.

Figure 25:
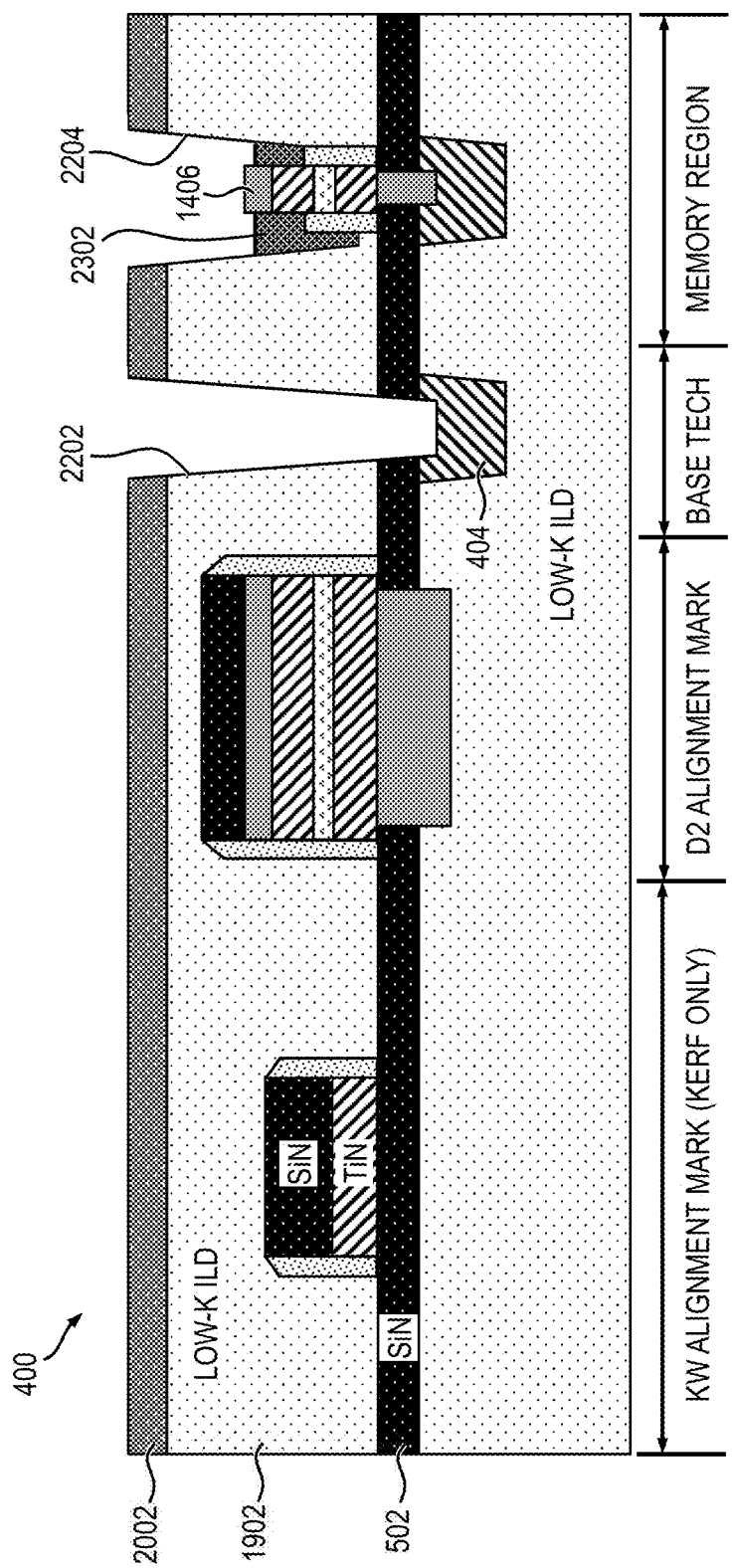
Figure 26:
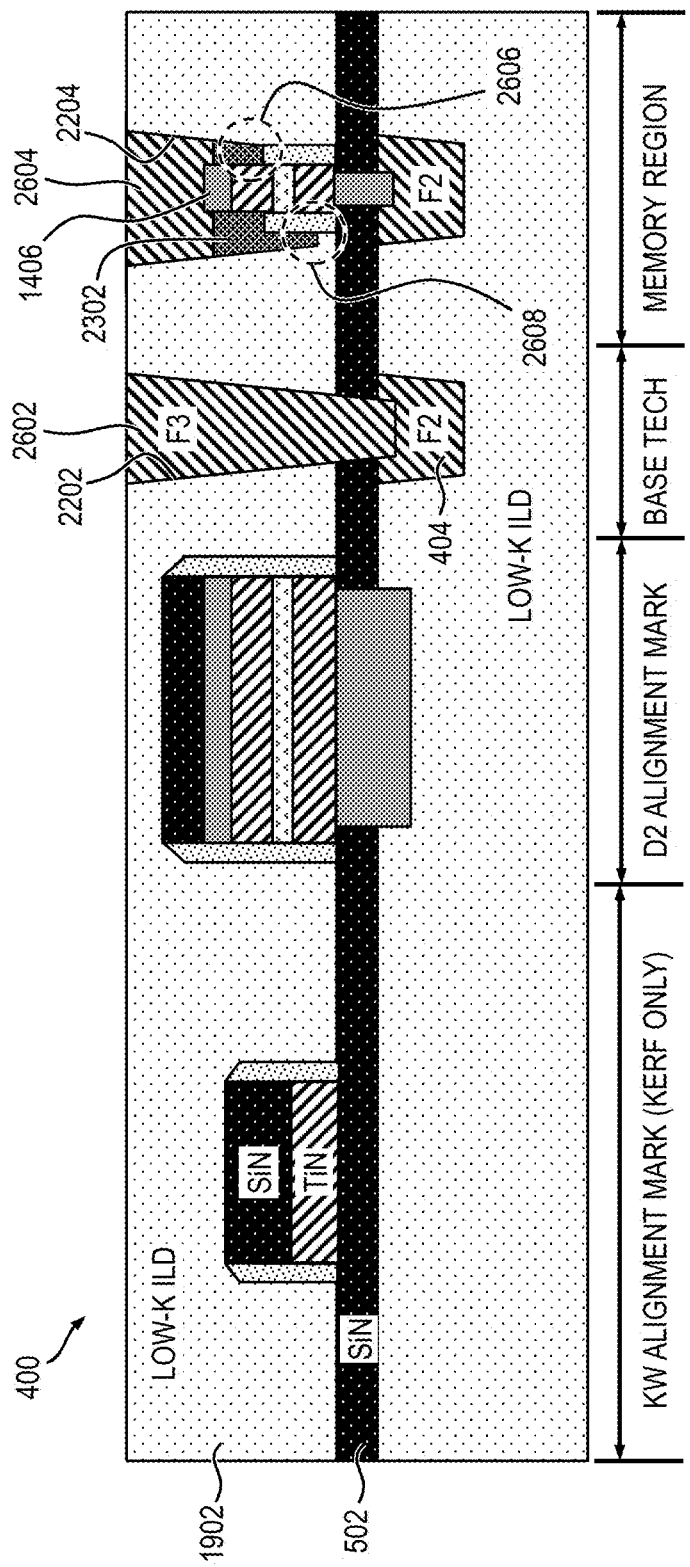

In FIG. 25, the sacrificial TiN hardmask layer (2004 in FIG. 24) is removed. In one or more embodiments, removal of the sacrificial TiN hardmask layer is achieved using a selective etch, such as, for example, diluted hydroperoxide or SC1 chemistry. The TiN used to form the top and bottom electrodes of the RRAM pillar are beneficially protected from damage during the TiN hardmask removal by the self-aligned conformal dielectric liner 2302; this dielectric liner material pinches-off the lower edge of the RRAM pillar and seals any exposed TiN. FIG. 26 depicts an upper level (F3) metallization process whereby copper, in one or more embodiments, is deposited filling the trenches 2202 and 2204 to form upper copper lines 2602 and 2604, respectively. A planarization process (e.g., CMP) is then performed to planarize the upper copper lines 2602, 2604 and to remove the sacrificial SiN layer (2002 in FIG. 25) down to the low-k dielectric layer 1902. As previously stated, the addition of the conformal dielectric liner 2302, which is self-aligned with a bottom of the upper copper line 2604, advantageously prevents TiN electrode damage to RRAM pillar, as highlighted in area 2606, and also prevents electrical shorting between the upper copper line 2604 and the bottom electrode of the RRAM pillar, as highlighted in area 2608.

Figure 27:
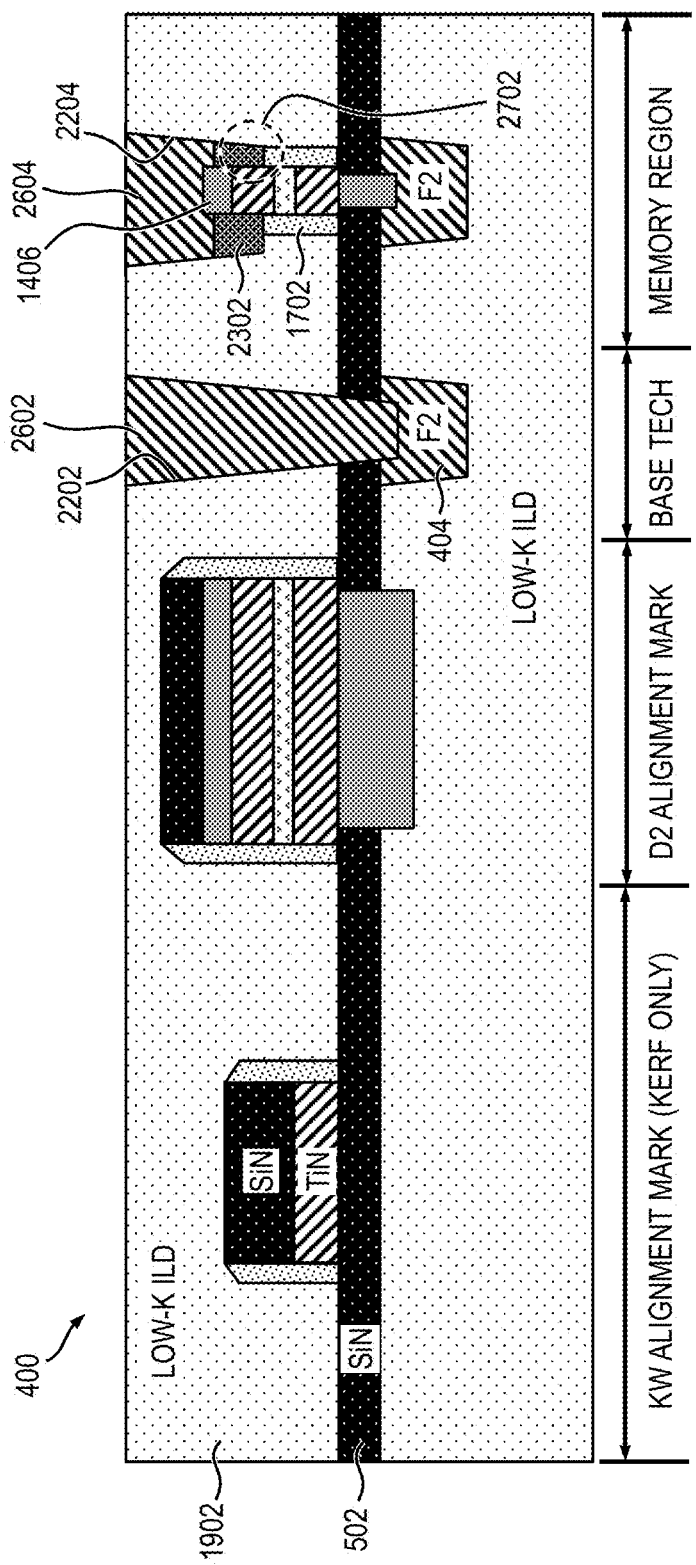
FIG. 27 is a cross-sectional view depicting at least a portion of an exemplary RRAM pillar integrated with corresponding copper lines, according to an alternative embodiment of the present invention.

In an alternative embodiment of the invention, with reference to FIG. 27, if the metal over-etch used to form trenches 2202 and 2204 is not too deep, such that the bottom of the trench 2204 does not recede below the top electrode of the RRAM pillar, then the self-aligned conformal liner 2302 may comprise metal, or similar electrically conductive material. As apparent from FIG. 27, the conformal liner 2302 is formed on an upper surface of the encapsulation layer 1702 forming sidewall spacers for protecting the RRAM pillar, as shown in area 2702. In this embodiment, the conformal liner 2302 preferably comprises, for example, TaN, ruthenium, etc. In this manner, the metal liner 2302, which again is self-aligned with the bottom of the upper copper line 2604, not only prevents damage to the underlying TiN electrodes of the RRAM pillar, but moreover provides a connection between the top electrode of the RRAM pillar and the upper copper line 2604 that exhibits a lower resistance, since the connection junction will have a larger surface area.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having RRAM devices therein formed in accordance with one or more embodiments of the invention.

An integrated circuit in accordance with aspects of the present disclosure can be employed in essentially any application and/or electronic system involving RRAM, such as, but not limited to, a crossbar array, etc. Suitable systems for implementing embodiments of the invention may include, but are not limited to, neuromorphic computing systems. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the structures and semiconductor fabrication methodologies described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above," "below," "upper," "lower," "top" and "bottom," as may be used herein, are intended to indicate the relative positioning of elements or structures to each other rather than absolute positioning.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A resistive random access memory (RRAM) structure, comprising:

top and bottom electrodes electrically coupled with first and second metal connection lines, respectively, the first and second metal connection lines providing electrical connection to the RRAM structure;

a layer of resistive switching material disposed between the top and bottom electrodes, the resistive switching material exhibiting a measurable change in resistance under influence of at least one of an electric field and heat;

dielectric spacers formed on sidewalls of at least the bottom electrode;

a passivation layer formed on an upper surface of the dielectric spacers and covering at least a portion of sidewalls of the top electrode, the passivation layer being self-aligned with the first metal connection line.

2. The RRAM structure of claim 1, wherein at least one of the top and bottom electrodes comprises a multiple-layer electrode.

3. The RRAM structure of claim 2, wherein at least one of the top and bottom electrodes comprises a first metal nitride layer and at least one of a second metal nitride layer and a first metal layer formed on an upper surface of the first metal nitride layer.

4. The RRAM structure of claim 3, wherein one of the first and second metal nitride layers comprises titanium nitride and another of the first and second metal nitride layers comprises tantalum nitride.

5. The RRAM structure of claim 3, wherein the first metal layer comprises at least one of tungsten and iridium.

6. The RRAM structure of claim 1, wherein an upper surface of the passivation layer is self-aligned with a bottom surface of the first metal connection line.

7. The RRAM structure of claim 1, wherein the layer of resistive switching material comprises hafnium oxide.

8. The RRAM structure of claim 1, wherein the passivation layer comprises at least one of silicon carbide, silicon dioxide, and silicon carbonate.

9. The RRAM structure of claim 1, wherein the passivation layer comprises a conformal dielectric liner.

10. The RRAM structure of claim 1, wherein the passivation layer comprises an electrically conductive material, and wherein the dielectric spacers are formed on sidewalls of the layer of resistive switching material and bottom electrode and are configured to electrically isolate the resistive switching material and bottom electrode from the passivation layer.

11. The RRAM structure of claim 10, wherein the passivation layer is electrically connected with the top electrode.

12. The RRAM structure of claim 1, wherein an overall width of the top and bottom electrodes and resistive switching layer is less than a width of the first metal connection line, to thereby enable scaling of the RRAM structure to a size that is less than a size of the first metal connection line.

* * * * *